United States Patent
Pan et al.

(10) Patent No.: US 11,898,268 B2
(45) Date of Patent: Feb. 13, 2024

(54) CALCIUM METABORATE BIREFRINGENT CRYSTAL, PREPARATION METHOD AND USE THEREOF

(71) Applicant: XinJiang Technical Institute of Physics & Chemistry, Chinese Academy of Sciences, Xinjiang (CN)

(72) Inventors: Shilie Pan, Urumqi (CN); Xinglong Chen, Urumqi (CN); Fangfang Zhang, Urumqi (CN)

(73) Assignee: XINJIANG TECHNICAL INSTITUTE OF PHYSICS & CHEMISTRY, CHINESE ACADEMY OF SCIENCES, Xinjiang (CN)

( * ) Notice: Subject to any disclaimer, the term of this patent is extended or adjusted under 35 U.S.C. 154(b) by 1040 days.

(21) Appl. No.: 16/627,556

(22) PCT Filed: Apr. 23, 2018

(86) PCT No.: PCT/CN2018/084012
§ 371 (c)(1),
(2) Date: Dec. 30, 2019

(87) PCT Pub. No.: WO2019/174105
PCT Pub. Date: Sep. 19, 2019

(65) Prior Publication Data
US 2020/0216976 A1    Jul. 9, 2020

(30) Foreign Application Priority Data
Mar. 15, 2018  (CN) .......................... 201810213648.5

(51) Int. Cl.
C30B 29/22 (2006.01)
C01B 35/12 (2006.01)
(Continued)

(52) U.S. Cl.
CPC ............ *C30B 29/22* (2013.01); *C01B 35/126* (2013.01); *C30B 9/12* (2013.01); *C30B 11/02* (2013.01);
(Continued)

(58) Field of Classification Search
None
See application file for complete search history.

(56) References Cited

FOREIGN PATENT DOCUMENTS

| CN | 1449998 A | 10/2003 |
|---|---|---|
| CN | 1850605 A | 10/2006 |
| CN | 106149055 A | 11/2016 |

OTHER PUBLICATIONS

Dec. 25, 2018 International Search Report issued in International Patent Application No. PCT/CN2018/084012.
(Continued)

*Primary Examiner* — Guinever S Gregorio
(74) *Attorney, Agent, or Firm* — Oliff PLC

(57) ABSTRACT

A calcium metaborate birefringent crystal and a preparation method and use thereof, the crystal having a chemical formula of $CaB_2O_4$ and a molecular weight of 125.70, and belonging to the orthorhombic crystal system and space group Pbcn with unit-cell parameters a=11.60(4)Å, b=4.28 (8)Å, c=6.21(6)Å, and Z=4, wherein the calcium metaborate birefringent crystal is a negative biaxial crystal with a transmission range of 165-3400 nm and a birefringence between 0.09-0.36; the crystal is applicable to infrared-visible-ultraviolet-deep ultraviolet bands, and is grown by a melt method, a flux method, a Bridgman method or a heat exchange method; the crystal obtained by the method of the present invention is easy to grow and easy to process; and can be used for making polarizing beam-splitting prisms.

12 Claims, 4 Drawing Sheets

(51) Int. Cl.
      *C30B 9/12*       (2006.01)
      *C30B 11/02*     (2006.01)
      *C30B 15/20*     (2006.01)
      *C30B 17/00*     (2006.01)
      *G02B 1/08*      (2006.01)
      *G02B 27/28*     (2006.01)

(52) U.S. Cl.
      CPC .............. *C30B 15/20* (2013.01); *C30B 17/00* (2013.01); *G02B 1/08* (2013.01); *G02B 27/283* (2013.01); *C01P 2002/72* (2013.01)

(56) References Cited

OTHER PUBLICATIONS

W.H. Zachariasen, "The Crystal Lattice of Calcium Metaborate, CaB2O4" Proceedings of the National Academy of Sciences of the United States of America, vol. 17, Dec. 31, 1931, pp. 617-619.

Y. Fujimoto et al, "Crystal growth and characterization of calcium metaborate scintillators", Nuclear Instruments and Methods in Physics Research A, pp. 7-10, 2013.

Y. Fujimoto et al. "Characterizations of Ce3+-Doped CaB2O4 Crystalline Scintillator" Crystal Growth & Design, pp. 142-147, vol. 12, 2012.

CALCIUM METABORATE BIREFRINGENT CRYSTAL, PREPARATION METHOD AND USE THEREOF

FIELD OF THE INVENTION

The invention relates to a calcium metaborate birefringent crystal having a molecular formula of CaB2O4 for use in the infrared-visible-deep ultraviolet ultraviolet bands, a preparation method and use thereof, and belongs to the technical fields of crystal materials and optics.

BACKGROUND OF THE INVENTION

When a light beam is incident into an anisotropic crystal material, it is divided into two beams which are refracted in different directions. This phenomenon is called birefringence, wherein the two beams of light generated by birefringence are linearly polarized light whose polarization directions are perpendicular to each other. With continuous expansion in the scope and depth of laser applications and rapid development of optical communication technology, birefringent crystals have become indispensable materials for modulating the polarization state of light. At present, birefringent crystals are key materials for making polarizing beam-splitting prisms such as Glan prisms and Wollaston prisms, as well as optical communication components such as optical isolators, beam displacers, and circulators. Generally a practical birefringent crystal is required to have as large a birefringence as possible in its operating band.

Commonly used birefringent crystal materials mainly include uniaxial crystals such as $YVO_4$ crystals, rutile crystals, $LiNbO_3$ crystals, calcite crystals, $\alpha$-$BaB_2O_4$ crystals, and $MgF_2$ crystals. $YVO_4$ is an artificial birefringent crystal with good performance, and is easy to grow into a crystal with high optical quality by a Czochralski method. However, with a transmission range of 400-5000 nm, it cannot be used in the ultraviolet region. Rutile has a large birefringence, but is high in hardness, which makes it very difficult to process devices. $LiNbO_3$ crystals can easily generate large-size crystals, but have a small birefringence, and thus are not conducive to miniaturization of devices in practical applications. Calcite crystals are mainly obtained from natural minerals, and are non-renewable resources, difficult to synthesize artificially. Generally, they are relatively small in size, which cannot meet the requirements of large-size optical polarizing elements. $\alpha$-$BaB_2O_4$ is a synthetic birefringent crystal with excellent performance, and has a large birefringence, a high laser damage threshold and a wide light transmission range. It can be widely used in near-infrared, visible and ultraviolet bands, and can be used in high-power laser systems. However, due to the solid-state phase transformation, $\alpha$-$BaB_2O_4$ crystals are liable to crack during growth. Although the phase transformation can be suppressed by a doping method, the crystal quality can decrease with the doping, and crystals with high optical quality are not easy to obtain. Furthermore, due to the limitation of the transmission range, $\alpha$-$BaB_2O_4$ is difficult to apply to the deep ultraviolet (<200 nm) band. $MgF_2$ crystals are a birefringent material with the most excellent performance in the deep ultraviolet region, and have been well applied in 193 nm lithography and other research fields. However, due to a very small birefringence, $MgF_2$ crystals cannot be used in manufacture of Glan prisms, and can only be used for Rochon prisms, and their beam splitting angle is small, while the device size is large, thereby leading to inconvenience in use. In addition, all commercial birefringent crystals at present are uniaxial crystals, and research on biaxial birefringent crystals is still rare. Therefore, there is a very urgent need to find a novel birefringent crystal material that can overcome the shortcomings of existing birefringent crystals.

At present, the exploration on deep ultraviolet birefringent crystals is mainly focused on borate systems, because borates containing boroxy groups with specific configuration generally have large birefringences, and their light transmission ranges can also cover the deep ultraviolet region. A series of borate birefringent crystals reported in the literature are mostly expansions based on $\alpha$-$BaB_2O_4$ crystals, such as $Ba_2Mg(B_3O_6)_2$, $Ba_2Ca(B_3O_6)_2$, $Na_3Ba_2(B_3O_6)_2F$, etc., all of which contain $B_3O_6$ groups capable of generating large birefringences. However, UV cutoff edges of crystals with $B_3O_6$ groups are not low enough, which severely restricts practical applications of the crystals in the deep ultraviolet region.

The calcium metaborate birefringent crystal provided by the present invention has a molecular formula of $CaB_2O_4$ and belongs to the orthorhombic crystal system. It was first synthesized in 1931 by W. H. Zachariasen et al., who provided a detailed crystal structure (reference document: Proceedings of the National Academy of Sciences of the United States of America 17 (11) (1931) 617). In 2012, Y. Fujimoto et al. used a micro-pulling-down method to grow the crystal and obtained a small wafer with a thickness of about 1 mm (reference document: Crystal Growth & Design 2012, 12, 142-146). In 2013, Y. Fujimoto et al. used a Czochralski method to grow the crystal. Using the small wafer obtained by the micro-pulling-down method as a seed crystal, and $CaCO_3$ and $H_3BO_3$ as raw materials, they carried out crystal growth using an iridium crucible under nitrogen protection. During the growth, the pulling speed was 0.7-1.0 mm/h, and the rotating speed was 15-20 r/min. The crystal grown by using this method cracked along a specific face, and the finally obtained crystal is still a wafer with a thickness of about 1 mm (reference document: Nuclear Instruments and Methods in Physics Research A 703 (2013) 7-10). Generally a crystal material for manufacturing an optical device needs to be a bulk single crystal and have a large size, and obviously a single crystal satisfying the required size for device manufacturing cannot be obtained by any method reported in the literature. For such a crystal, preparation of a large-size bulk single crystal, the birefringence properties of the crystal, and its uses as a birefringent crystal have not been reported.

For the first time, we have studied the birefringence-related properties of calcium metaborate. Our theoretical study showed that an $(BO_2)_\infty$ infinite chain contained in the crystal structure is a novel functional element capable of generating a large birefringence. Experimental results proved that the crystal has a larger birefringence, better deep ultraviolet transmission capability and a higher laser damage threshold than other borate birefringent crystals. Furthermore, the calcium metaborate crystal provided by the invention has excellent physical and chemical properties such as moderate hardness, no deliquescence, and easy processing. Therefore, the crystal is a birefringent crystal material with a very high application value.

It needs to be noted that although Y. Fujimoto et al. carried out the growth of the crystal by the Czochralski method in 2013, the method for preparing the calcium metaborate crystal by the Czochralski method involved in the present invention has obvious differences from the Czochralski method reported in the literature previously: (1) the Czochralski method involved in the present invention is carried out with a platinum crucible, and nitrogen protection is not required during the growth process, which not only reduces the cost of crystal preparation, but also is conducive to improving the quality and size of the crystal; 2) in the preparation of calcium metaborate by the Czochralski method in the present invention, the seed crystal is obtained in a pulling furnace, and the obtained seed crystal has better quality and a larger size, which lays a good foundation for preparation of a large-size, high-quality crystal; (3) the pulling furnace for preparing the calcium metaborate crystal by the Czochralski method in the present invention has an upper weighing control system, so the growth amount of the crystal per unit time and the diameter of the crystal can be accurately controlled; (4) a growth interface of the crystal is controlled by adjusting the temperature gradient above a melt of the platinum crucible in conjunction with the pulling speed and rotating speed during crystal growth to find the best growth process parameters so that it keeps stable convex interface growth, which is beneficial to reducing various defects in the crystal to improve the quality of the crystal, thereby avoiding crystal cracking caused by defects, and being conducive to increasing the size of the crystal; (5) in the growth process, we perform necking on the seed crystal in conjunction with (3)-(4) to further optimize the crystal quality, and then controlling the shouldering angle to avoid the occurrence of polymorphism and the like; and (6) after the end of crystal growth, we also uses a reasonable cooling rate to prevent cracking of the crystal cause by stress; and therefore, using the Czochralski method provided in the present invention, the cracking problem during crystal growth and cooling can be avoided, and a high-quality, large-size bulk single crystal can be obtained.

The calcium metaborate birefringent crystal prepared by using the method provided in the invention has the characteristics of high crystal quality, large crystal size, good optical uniformity, etc., can meet device manufacturing requirements, can be used for making polarizing beam-splitting prisms such as Glan prisms, Wollaston prisms, Rochon prisms, Nicol prisms, and Senarmont prisms, as well as optical elements such as polarization beam splitters, optical isolators, circulators, beam displacers, optical polarizers, optical polarization analyzers, optical polarization apparatuses, optical modulators, polarization beam splitters, phase delay devices, and electro-optical modulation devices, and is liable to be widely applied in the infrared-visible-deep ultraviolet ultraviolet bands.

SUMMARY OF THE INVENTION

An objective of the present invention is providing a calcium metaborate birefringent crystal having a chemical formula of $CaB_2O_4$ and a molecular weight of 125.70, and belonging to the orthorhombic crystal system and space group Pbcn with unit-cell parameters a=11.60(4)Å, b=4.28 (8)Å, c=6.21 (6)Å, and Z=4, wherein the calcium metaborate birefringent crystal is a negative biaxial crystal with a transmission range of 165-3400 nm covering the infrared-visible-ultraviolet-deep ultraviolet bands and a large birefringence between 0.09-0.36; the crystal laser has a high laser damage threshold and moderate hardness, and is easy to process, stable in air, and not prone to deliquesce.

Another objective of the present invention is providing a preparation method of the calcium metaborate birefringent crystal.

Yet another objective of the present invention is providing a use of the calcium metaborate birefringent crystal.

A calcium metaborate birefringent crystal of the present invention has a chemical formula of $CaB_2O_4$ and a molecular weight of 125.70, and belongs to the orthorhombic crystal system and space group Pbcn with unit-cell parameters a=11.60(4)Å, b=4.28(8)Å, c=6.21(6)Å, and Z=4, wherein the calcium metaborate birefringent crystal is a negative biaxial crystal with a transmission range of 165-3400 nm and a birefringence between 0.09-0.36.

In a preparation method of the calcium metaborate birefringent crystal, a melt method, a flux method, a Bridgman method or a heat exchange method is used for preparing the crystal;

the preparation of the calcium metaborate birefringent crystal using the melt method is specifically operated in the following steps:

a. uniformly mixing a calcium-containing compound and a boron-containing compound with a molar ratio of calcium to boron of 1:2 and thoroughly grinding the same, then pre-sintering the mixture in a corundum crucible at a temperature of 300° C. for 4 hours, taking out and compacting the mixture, then raising the temperature to 900° C., keeping the temperature for 1-3 days to obtain polycrystalline powder of a calcium metaborate compound, and performing X-ray analysis on the powder, to obtain an X-ray spectrum consistent with that after a calcium metaborate single crystal is ground into powder; and then putting the obtained polycrystalline powder of the calcium metaborate compound into a platinum crucible, heating the powder to a temperature of 1160-1180° C., and keeping the temperature constant for 1-50 hours to obtain a mixed melt;

or directly mixing uniformly a calcium-containing compound and a boron-containing compound with a molar ratio of calcium to boron of 1:2, fully grinding the mixture and putting the same into a platinum crucible, slowly heating the mixture to a temperature of 1160-1180° C., and keeping the temperature constant for 10-50 hours to obtain a mixed melt;

wherein the calcium-containing compound is calcium oxide, calcium hydroxide, calcium carbonate, calcium nitrate, calcium acetate, calcium oxalate or calcium metaborate, and the boron-containing compound is boric acid, boron oxide or calcium metaborate;

b, preparing a calcium metaborate seed crystal: rapidly cooling the mixed melt obtained in step a by 5-10° C., keeping a corresponding temperature for 2-6 hours, repeating the process of cooling and heat preservation until a floating crystal appears on the liquid surface, then slowly cooling down at a rate of 0.1-5° C./d until crystallization is completed, and then cooling to the room temperature at a cooling rate of 20° C./h, to obtain a calcium metaborate seed crystal by spontaneous crystallization;

or immersing a platinum wire fixed at a lower end of a seed rod into the mixed melt obtained in step a, slowly cooling down at a rate of 1-5° C./h until a crystal appears on the platinum wire, then rotating the seed rod at a rotation rate of 0-30 r/min, slowly cooling down at a rate of 0.1-5° C./d while pulling the crystal up at a speed of 0-3 mm/h, and after the crystal is grown to a desired size, lifting the same off the liquid surface, and cooling to the room temperature at a cooling rate of 20° C./h, to obtain a calcium metaborate seed crystal; and c. placing the crucible containing the mixed melt prepared in step a into a crystal growth furnace, fixing the seed crystal obtained in step b to a seed rod, cooling down to 1152-1158° C., lowering the seed crystal from the top of the crystal growth furnace into a hearth, first preheating the seed crystal for 10 minutes above the mixed melt, then lowering the seed crystal onto the surface of the melt or into the melt for meltback, keeping a constant temperature for 1-20 minutes, then rapidly cooling to 1145-1150° C., and slowly cooling at a rate of 0.1-5° C./d, rotating the seed rod at a rotation speed of 0-30 r/min while pulling the crystal up at a speed of 0-3 mm/h, carrying out a necking and shouldering process to optimize the crystal quality, and after the crystal grows to a desired size, lifting the crystal off the liquid surface and cooling to the room temperature at a cooling rate of 5-20° C./h, and taking out the crystal from the hearth to obtain a centimeter-sized calcium metaborate birefringent crystal;

the preparation of the calcium metaborate birefringent crystal using the flux method is specifically operated in the following steps:

a. uniformly mixing a calcium-containing compound and a boron-containing compound with a molar ratio of calcium to boron of 1:2 and thoroughly grinding the same, then pre-sintering the mixture in a corundum crucible at a temperature of 300° C. for 4 hours, taking out and compacting the mixture, then raising the temperature to 900° C., keeping the temperature for 1-3 days to obtain polycrystalline powder of a calcium metaborate compound, and performing X-ray analysis on the powder, to obtain an X-ray spectrum consistent with that after a calcium metaborate single crystal is ground into powder; and then uniformly mixing the obtained polycrystalline powder of the calcium metaborate compound and a flux and putting the mixture into a platinum crucible, heating the mixture to a temperature of 900-1160° C., and keeping the temperature constant for 1-50 hours to obtain a mixed solution containing the flux, wherein the molar ratio of the calcium metaborate compound to the flux is 1:0.01-4;

or directly weighing and mixing uniformly a calcium-containing compound, a boron-containing compound and a flux with a molar ratio of Ca:B:flux of 1:2:0.01-4, fully grinding the mixture and putting the same into a platinum crucible, slowly heating the mixture to a temperature of 900-1160° C., and keeping the temperature constant for 10-50 hours to obtain a mixed solution containing the flux;

wherein the calcium-containing compound is calcium oxide, calcium hydroxide, calcium carbonate, calcium nitrate, calcium acetate, calcium oxalate or calcium metaborate; the boron-containing compound is boric acid, boron oxide or calcium metaborate; the flux is boron oxide, boric acid, sodium carbonate, sodium hydroxide, sodium fluoride, sodium nitrate, lithium fluoride, lithium hydroxide, lithium carbonate, lithium nitrate, or a mixture of a lithium-containing compound and a boron-containing compound, or a mixture of a sodium-containing compound and a boron-containing compound; wherein the molar ratio of lithium to boron in the mixture of the lithium-containing compound and the boron-containing compound is Li:B of 1-3:1, and the molar ratio of sodium to boron in the mixture of the sodium-containing compound and the boron-containing compound is Na:B of 1-3:1;

b, preparing a calcium metaborate seed crystal: rapidly cooling the mixed solution containing the flux obtained in step a by 5-10° C., keeping a corresponding temperature for 2-6 hours, repeating the process of cooling and heat preservation until a floating crystal appears on the liquid surface, then slowly cooling down at a rate of 0.1-5° C./d until crystallization is completed, and then cooling to the room temperature at a cooling rate of 20° C./h, to obtain a calcium metaborate seed crystal by spontaneous crystallization;

or immersing a platinum wire fixed at a lower end of a seed rod into the mixed solution containing the flux obtained in step a, slowly cooling down at a rate of 1-5° C./h until a crystal appears on the platinum wire, then rotating the seed rod at a rotation rate of 0-30 r/min, slowly cooling down at a rate of 0.1-5° C./d, and after the crystal is grown to a desired size, lifting the same off the liquid surface, and cooling to the room temperature at a cooling rate of 20° C./h, to obtain a calcium metaborate seed crystal; and c. placing the crucible containing the mixed solution prepared in step a into a crystal growth furnace, fixing the seed crystal obtained in step b to a seed rod, cooling down to 850-1150° C., lowering the seed crystal from the top of the crystal growth furnace into a hearth, first preheating the seed crystal for 10 minutes above the surface of the mixed solution, then lowering the seed crystal onto the surface of the liquid or into the liquid for meltback, keeping a constant temperature for 1-20 minutes, then rapidly cooling to 845-1145° C., and slowly cooling at a rate of 0.1-5° C./d, rotating the seed rod at a rotation speed of 0-30 r/min while pulling the crystal up at a speed of 0-3 mm/h, and after the crystal grows to a desired size, lifting the crystal off the liquid surface and cooling to the room temperature at a cooling rate of 5-20° C./h, and taking out the crystal from the hearth to obtain a centimeter-sized calcium metaborate birefringent crystal;

the preparation of the calcium metaborate birefringent crystal using the Bridgman method is specifically operated in the following steps:

a. uniformly mixing a calcium-containing compound and a boron-containing compound with a molar ratio of calcium to boron of 1:2-2.1 and thoroughly grinding the same, then pre-sintering the mixture in a corundum crucible at a temperature of 300° C. for 4 hours, taking out and compacting the mixture, then raising the temperature to 900° C., keeping the temperature for 2 days to obtain a mixed raw material for crystal growth; wherein the calcium-containing compound is calcium oxide, calcium hydroxide, calcium carbonate, calcium nitrate, calcium acetate, calcium oxalate or calcium metaborate, and the boron-containing compound is boric acid, boron oxide or calcium metaborate;

b. preparing a calcium metaborate seed crystal: putting the mixed raw material obtained in step a into a platinum crucible for a Bridgman method, placing the crucible into a temperature gradient furnace, and heating the same to a temperature of 1200° C. to completely melt the mixed raw material in the crucible, keeping the temperature constant for 10 hours, then lowering the crucible at a rate of 0.1-2 mm/h, so that the melt or solution in the crucible slowly crystallizes from bottom to top, and after the crystallization is completed, cooling to the room temperature at a cooling rate of 20° C./h to obtain a calcium metaborate seed crystal; and c. putting the seed crystal into a seed well at the bottom of the platinum crucible for the Bridgman method, then putting the mixed raw material obtained in step a into the crucible, placing the crucible into a temperature gradient furnace, heating the same to a temperature of 1150-1180° C., keeping the temperature constant for 1-20 hours, to completely melt the mixed raw material in the crucible and keep the seed crystal at the bottom in a crystalline state, then lowering the crucible at a rate of 0.1-2 mm/h, so that the melt or solution in the crucible slowly crystallizes from bottom to top, and after the crystallization is completed, cooling to the room temperature at a cooling rate of 5-20° C./h to obtain a centimeter-sized calcium metaborate single crystal;

the preparation of the calcium metaborate birefringent crystal using the heat exchange method is specifically operated in the following steps:

a. uniformly mixing a calcium-containing compound and a boron-containing compound with a molar ratio of calcium to boron of 1:2-2.1 and thoroughly grinding the same, then pre-sintering the mixture in a corundum crucible at a temperature of 300° C. for 4 hours, taking out and compacting the mixture, then raising the temperature to 900° C., keeping the temperature for 2 days to obtain a mixed raw material for crystal growth; wherein the calcium-containing compound is calcium oxide, calcium hydroxide, calcium carbonate, calcium nitrate, calcium acetate, calcium oxalate or calcium metaborate, and the boron-containing compound is boric acid, boron oxide or calcium metaborate;

b. preparing a calcium metaborate seed crystal: putting the mixed raw material obtained in step into a platinum crucible for a heat exchange method, placing the crucible into a heat exchange furnace, heating the same to a temperature of 1200° C. to completely melt the mixed raw material in the crucible, keeping the temperature constant for 10 hours, then cooling down at a rate of 0.1-1° C./h, so that the melt or solution in the crucible slowly crystallizes from bottom to top, and after the crystallization is completed, cooling to the room temperature at a cooling rate of 20° C./h to obtain a calcium metaborate seed crystal; and c. putting the seed crystal into a seed well at the bottom of the platinum crucible for the heat exchange method, then putting the mixed raw material obtained in step a into the crucible, heating the same to a temperature of 1150-1180° C., keeping the temperature constant for 1-20 hours, to completely melt the raw material in the crucible and keep the seed crystal at the bottom in a crystalline state, creating a temperature distribution in which the temperature falls from top to bottom through a heater, a reflective insulation screen and a seed rod cooling device, then cooling at a rate of 0.1-1° C./h so that the melt in the crucible slowly crystallizes from bottom to top, and after the crystallization is completed, cooling to the room temperature at a cooling rate of 5-20° C./h to obtain a centimeter-sized calcium metaborate single crystal.

The melt method includes a melt top seeded method, a melt pulling method and a Kyropoulos method.

The purities of the calcium-containing compound and the boron-containing compound are larger than or equal to 99.0%.

The purity of the flux is larger than or equal to 99.0%.

Provided is a use of the calcium metaborate birefringent crystal in preparation of a multi-band polarizing beam-splitting prism or optical element.

The polarizing beam-splitting prism is a Glan prism, Wollaston prism, Rochon prism, Nicol prism or Senarmont prism.

The optical element is a polarization beam splitter, optical isolator, circulator, beam displacer, optical polarizer, optical polarization analyzer, optical polarization apparatus, optical modulator, polarization beam splitter, phase delay device, or electro-optical modulation device.

The prepared polarizing beam-splitting prism or optical element is used for multiple bands including infrared, visible, ultraviolet and deep ultraviolet bands.

In the preparation of the calcium metaborate birefringent crystal in the present invention, the following chemical equations are involved:

$CaCO_3 + 2H_3BO_3 \rightarrow CaB_2O_4 + CO_2\uparrow + H_2O\uparrow$ $Ca(OH)_2 + 2H_3BO_3 \rightarrow CaB_2O_4 + H_2O\uparrow$ $CaO + 2H_3BO_3 \rightarrow CaB_2O_4 + H_2O\uparrow$ $Ca(NO_3)_2 + 2H_3BO_3 \rightarrow CaB_2O_4 + NO_2\uparrow + H_2O\uparrow$ $CaC_2O_4 + 2H_3BO_3 \rightarrow CaB_2O_4 + CO_2\uparrow + H_2O\uparrow$ $Ca(CH_3COO)_2 + 2H_3BO_3 \rightarrow CaB_2O_4 + CO_2\uparrow + H_2O\uparrow$ $CaCO_3 + B_2O_3 \rightarrow CaB_2O_4 + CO_2\uparrow$ $Ca(OH)_2 + B_2O_3 \rightarrow CaB_2O_4 + H_2O\uparrow$ $CaO + B_2O_3 \rightarrow CaB_2O_4$ $Ca(NO_3)_2 + B_2O_3 \rightarrow CaB_2O_4 + NO_2\uparrow$ $CaC_2O_4 + B_2O_3 \rightarrow CaB_2O_4 + CO_2\uparrow$ $Ca(CH_3COO)_2 + B_2O_3 \rightarrow CaB_2O_4 + CO_2\uparrow + H_2O\uparrow$.

The calcium metaborate birefringent crystal obtained by the method of the present invention can be used as an optical crystal in the infrared-visible-ultraviolet-deep ultraviolet bands. It especially needs to be stressed that the crystal has a large birefringence, excellent deep ultraviolet transmission capability, and a very high laser damage threshold, and it has obvious advantages over other birefringent crystals and can be used in high-power laser systems as well as a broad spectral region, thereby compensating for the shortcomings of existing deep ultraviolet birefringent crystals. A high-quality large-size crystal can be easily obtained by the method provided in the present invention, and the crystal is easy to process, stable in air, and not prone to deliquesce; and it can be widely used to prepare polarizing beam splitting prisms and optical elements for infrared-visible-ultraviolet-deep ultraviolet bands. Therefore, the calcium metaborate birefringent crystal is an optical crystal material with a very high application value.

DETAILED DESCRIPTION OF THE EMBODIMENTS

Embodiment 1

Figure 1:
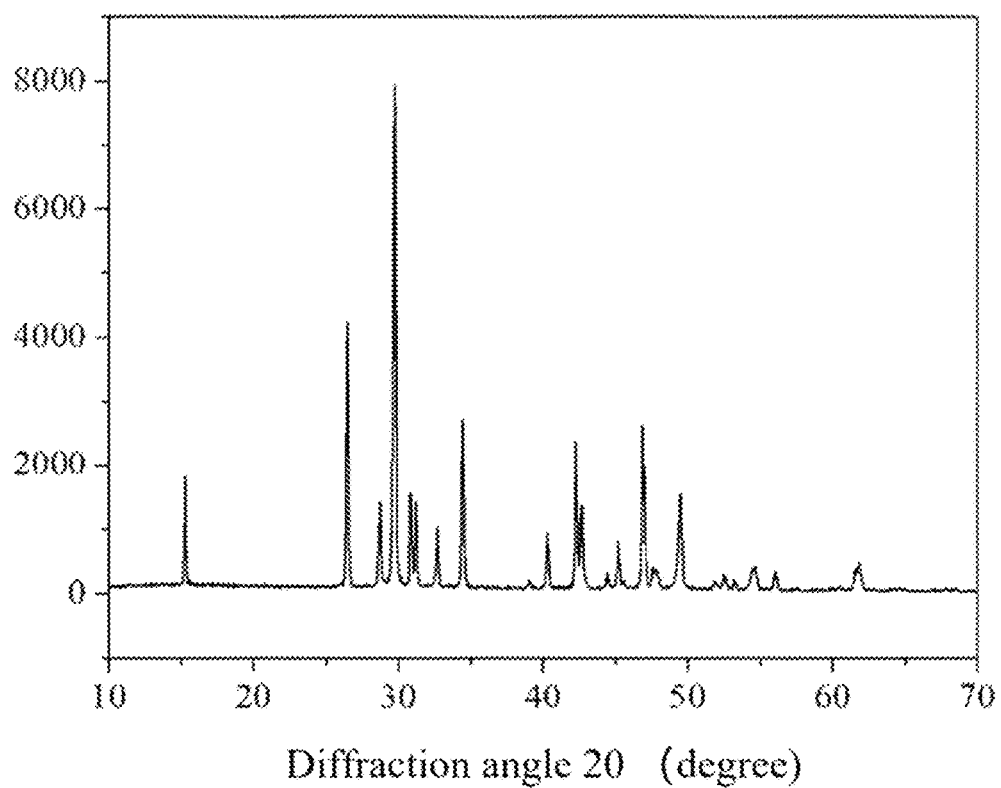
FIG. 1 shows an XRD spectrum of a calcium metaborate birefringent crystal for infrared-visible-ultraviolet-deep ultraviolet bands.
Figure 2:
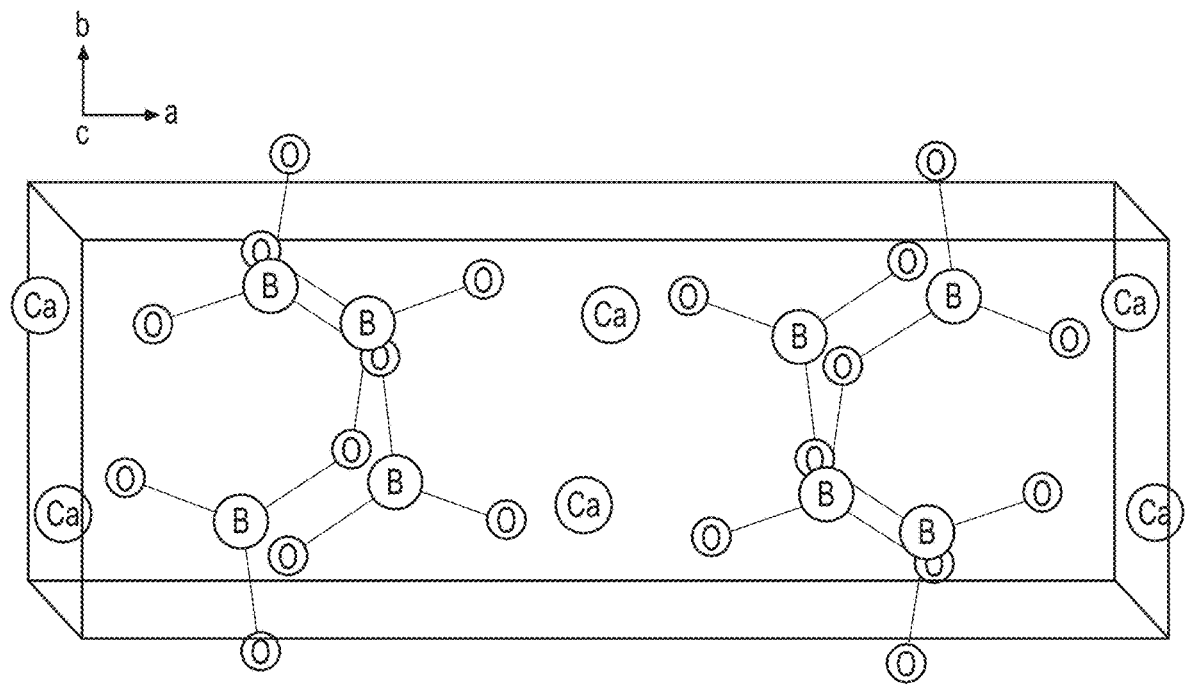
FIG. 2 shows a structural diagram of a calcium metaborate birefringent crystal for infrared-visible-ultraviolet-deep ultraviolet bands.

Growth of a calcium metaborate birefringent crystal by a melt pulling method:

- A calcium metaborate birefringent crystal was prepared according to a chemical equation $CaO+2H_3O_3 \rightarrow CaB_2O_4 + H_2O \uparrow$, using raw materials CaO and $H_3BO_3$ which were analytically pure (larger than or equal to 99%):
- or CaO and $H_3BO_3$ were directly mixed uniformly with a molar ratio of calcium to boron of 1:2, fully ground, put into a platinum crucible, and slowly heated to a temperature of 1180° C., and the temperature was kept constant for 24 hours to obtain a mixed melt;
- preparation of a calcium metaborate seed crystal: the mixed melt obtained was rapidly cooled by 5° C., and kept at a temperature of 1175° C. for 2 hours, and the process of cooling and heat preservation was repeated until a floating crystal appeared on the liquid surface of the mixed melt, and then the mixture was slowly cooled at a rate of 0.1° C./d until crystallization was completed, and the mixture was cooled to the room temperature at a cooling rate of 20° C./h, to obtain a calcium metaborate seed crystal by spontaneous crystallization;
- the crucible containing the mixed melt was placed into a crystal growth furnace; the seed crystal obtained was fixed to a seed rod, and cooled down to 1152° C.; the seed crystal was lowered from the top of the crystal growth furnace into a hearth; the seed crystal was first preheated for 5 minutes above the liquid surface, then lowered onto the surface of the mixed melt for meltback, kept at a constant temperature for 20 minutes, and then rapidly cooled to 1145° C.; the seed rod was rotated at a rotation speed of 2 r/min while pulling the crystal up at a speed of 1 mm/h; after crystal growth started, a necking and shouldering process was carried out to further optimize the crystal quality, then the pulling speed was controlled at 0.5 mm/h, and the crystal was slowly cooled at a rate of 0.5° C./d, and the crystal started equal-diameter growth; and after the crystal grew to a desired size, the crystal was lifted off the surface of the mixed melt and cooled to the room temperature at a cooling rate of 5° C./h, and the crystal was taken out from the hearth to obtain a calcium metaborate birefringent crystal with a size of 42×22×53 mm³.

A transparent region of the crystal obtained by this method was large. The obtained crystal was subjected to a transmission test, and results showed that the crystal had a transmission range of 165 to 3400 nm, and a birefringence test showed that the crystal had a birefringence of 0.09 to 0.36.

Embodiment 2

Growth of a calcium metaborate birefringent crystal by a melt pulling method:

- an analytically pure (larger than or equal to 99%) calcium metaborate compound was directly weighed, put into a platinum crucible, and slowly heated to a temperature of 1170° C., and the temperature was kept constant for 10 hours to obtain a mixed melt;
- preparation of a calcium metaborate seed crystal: a platinum wire fixed at a lower end of a seed rod was lowered into the mixed melt obtained, and slowly cooled down at a rate of 5° C./h until a crystal appeared on the platinum wire; then the seed rod was rotated at a rotation rate of 5 r/min, and slowly cooled down at a rate of 2° C./d while pulling the crystal up at a speed of 1 mm/h; and after the crystal is grown to a desired size, the crystal was lifted off the liquid surface, and cooled to the room temperature at a cooling rate of 20° C./h, to obtain a calcium metaborate seed crystal;
- the crucible containing the mixed melt prepared was placed into a crystal growth furnace; the seed crystal obtained was fixed to a seed rod, and cooled down to 1155° C.; the seed crystal was lowered from the top of the crystal growth furnace into a hearth; the seed crystal was first preheated for 5 minutes above the liquid surface, then lowered onto the surface of the mixed melt for meltback, kept at a constant temperature for 1 minute, and then rapidly cooled to 1148° C.; the seed rod was rotated at a rotation speed of 4 r/min while pulling the crystal up at a speed of 1.5 mm/h; after crystal growth started, a shouldering and necking process was carried out to further optimize the crystal quality, then the pulling speed was controlled at 0.3 mm/h, and the crystal was slowly cooled at a rate of 0.5-1° C./d, and the crystal started equal-diameter growth; and after the crystal grew to a desired size, the crystal was lifted off the surface of the mixed melt and cooled to the room temperature at a cooling rate of 10° C./h, and the crystal was taken out from the hearth to obtain a calcium metaborate birefringent crystal with a size of 31×19×47 mm³.

Embodiment 3

Growth of a calcium metaborate birefringent crystal by a melt pulling method:

- A calcium metaborate birefringent crystal was prepared according to a chemical equation $CaCO_3 + 2H_2BO_2 \rightarrow CaB_2O_4 + CO_2 \uparrow + H_2O \uparrow$, using raw materials $CaCO_3$ and $H_3BO_3$ which were analytically pure (larger than or equal to 99%):
- $CaCO_3$ and $H_3BO_3$ were uniformly mixed with a molar ratio of calcium to boron of 1:2 and thoroughly ground; then the mixture was pre-sintered in a corundum crucible at a temperature of 300° C. for 4 hours, taken out and compacted, then heated to 900° C., and kept at the temperature for 2 days to obtain polycrystalline powder of a calcium metaborate compound; and X-ray analysis is performed on the powder, to obtain an X-ray spectrum consistent with that after a calcium metaborate single crystal was ground into powder;

the polycrystalline powder of the synthesized calcium metaborate compound was put into a platinum crucible, and heated to a temperature of 1160° C., and the temperature was kept constant for 1 hour to obtain a mixed melt;

preparation of a calcium metaborate seed crystal: the mixed melt obtained was rapidly cooled by 10° C., and kept at a corresponding temperature for 6 hours, and the process of cooling and heat preservation was repeated until a floating crystal appeared on the liquid surface, and then the mixture was slowly cooled at a rate of 5° C./d until crystallization was completed, and the mixture was cooled to the room temperature at a cooling rate of 20° C./h, to obtain a calcium metaborate seed crystal by spontaneous crystallization;

the crucible containing the mixed melt prepared was placed into a crystal growth furnace; the seed crystal obtained was fixed to a seed rod and cooled down to 1158° C.; the seed crystal was lowered from the top of the crystal growth furnace into a hearth, first preheated for 10 minutes above the surface of the mixed melt, then lowered to contact the surface of the mixed melt for meltback, kept at a constant temperature for 1 minute, then rapidly cooled to 1150° C., and slowly cooled at a rate of 1-5° C./d; the seed rod was rotated at a rotation speed of 30 r/min to ensure good growth of the crystal while pulling the crystal up at a speed of 3 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 14×16×46 mm$^3$.

Embodiment 4

Growth of a calcium metaborate birefringent crystal by a melt pulling method:

A calcium metaborate birefringent crystal was prepared according to a chemical equation $Ca(OH)_2 + 2H_3BO_3 \rightarrow CaB_2O_4 + H_2O\uparrow$, using raw materials $Ca(OH)_2$ and $H_3BO_3$ which were analytically pure (larger than or equal to 99%):

$Ca(OH)_2$ and $H_3BO_3$ were uniformly mixed with a molar ratio of calcium to boron of 1:2 and thoroughly ground; then the mixture was pre-sintered in a corundum crucible at a temperature of 300° C. for 4 hours, taken out and compacted, then heated to a temperature of 900° C., and kept at the temperature for 2 days to obtain polycrystalline powder of a calcium metaborate compound; and X-ray analysis is performed on the powder, to obtain an X-ray spectrum consistent with that after a calcium metaborate single crystal was ground into powder;

the polycrystalline powder of the synthesized calcium metaborate compound was put into a platinum crucible, and heated to a temperature of 1180° C., and the temperature was kept constant for 10 hours to obtain a mixed melt;

preparation of a calcium metaborate seed crystal: a platinum wire fixed at a lower end of a seed rod was lowered into the mixed melt obtained, and slowly cooled down at a rate of 5° C./h until a crystal appeared on the platinum wire; then the seed rod was rotated at a rotation rate of 30 r/min, and slowly cooled down at a rate of 3° C./d while pulling the crystal up at a speed of 3 mm/h; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 1154° C.; the seed crystal was lowered from the top of the crystal growth furnace into a hearth, first preheated for 10 minutes above the liquid surface, then lowered into the mixed melt for meltback, kept at a constant temperature for 5 minutes, rapidly cooled to 1149° C., and slowly cooled at a rate of 3° C./d; the seed rod was rotated at a rotation speed of 15 r/min to ensure good growth of the crystal while pulling the crystal up at a speed of 0.1 mm/h; and after the crystal grew to a desired size, the crystal was lifted off the surface of the mixed melt and cooled to the room temperature at a cooling rate of 15° C./h, and taken out from the hearth to obtain a calcium metaborate birefringent crystal with a size of 12×19×26 mm$^3$.

Embodiment 5

Growth of a calcium metaborate birefringent crystal by a melt top seeded method:

A calcium metaborate birefringent crystal was prepared according to a chemical equation $Ca(NO_3)_2 + 2H_3BO_3 \rightarrow CaB_2O_4 + NO_2\uparrow + H_2O\uparrow$, using raw materials $Ca(NO_3)_2$ and $H_3BO_3$ which were analytically pure (larger than or equal to 99%):

$Ca(NO_3)_2$ and $H_3BO_3$ are uniformly mixed with a molar ratio of calcium to boron of 1:2 and thoroughly ground; then the mixture was pre-sintered in a corundum crucible at a temperature of 300° C. for 4 hours, taken out and compacted; then the temperature was slowly raised to 900° C., and the temperature was kept for 2 days to obtain polycrystalline powder of a calcium metaborate compound; X-ray analysis was performed on the powder, to obtain an X-ray spectrum consistent with that after a calcium metaborate single crystal is ground into powder; and the polycrystalline powder of the synthesized calcium metaborate compound was put into a platinum crucible, and heated to a temperature of 1180° C., and the temperature was kept constant for 1 hour to obtain a mixed melt;

preparation of a calcium metaborate seed crystal: the mixed melt obtained was rapidly cooled by 7° C., and kept at a corresponding temperature for 4 hours, and the process of cooling and heat preservation was repeated until a floating crystal appeared on the melt surface, and then the mixture was slowly cooled at a rate of 3° C./d until crystallization was completed, and the mixture was cooled to the room temperature at a cooling rate of 20° C./h, to obtain a calcium metaborate seed crystal by spontaneous crystallization;

the crucible containing the mixed melt prepared was placed into a crystal growth furnace; the seed crystal obtained was fixed to a seed rod and cooled down to 1152° C.; the seed crystal was lowered from the top of the crystal growth furnace into a hearth, first preheated for 10 minutes above the surface of the mixed melt, then lowered to contact the surface of the mixed melt for meltback, kept at a constant temperature for 8 minutes, then rapidly cooled to 1146° C., and slowly cooled at a rate of 2° C./d; the seed rod was rotated at a rotation speed of 0r/min while pulling the crystal up at a speed of 0 mm/h; and after the crystal grew to a desired size, the crystal was lifted off the surface of the mixed melt and cooled to the room temperature at a cooling rate of 30° C./h, and taken out from the hearth to obtain a calcium metaborate birefringent crystal with a size of 35×19×11 mm³.

Embodiment 6

Growth of a calcium metaborate birefringent crystal by a Kyropoulos method:

A calcium metaborate birefringent crystal was prepared according to a chemical equation $CaCO_3+B_2O_3 \rightarrow CaB_2O_4+CO_2\uparrow$, using raw materials $CaCO_3$ and $B_2O_3$ which were analytically pure (larger than or equal to 99%):

$CaCO_3$ and $B_2O_3$ were directly mixed uniformly with a molar ratio of calcium to boron of 1:2, fully ground, put into a platinum crucible, and slowly heated to a temperature of 1160° C., and the temperature was kept constant for 50 hours to obtain a mixed melt;

preparation of a calcium metaborate seed crystal: the mixed melt obtained was rapidly cooled by 6° C., and kept at a corresponding temperature for 3 hours, and the process of cooling and heat preservation was repeated until a floating crystal appeared on the melt surface, and then the mixture was slowly cooled at a rate of 8° C./d until crystallization was completed, and the mixture was cooled to the room temperature at a cooling rate of 40° C./h, to obtain a calcium metaborate seed crystal by spontaneous crystallization;

the crucible containing the mixed melt prepared was placed into a crystal growth furnace; the seed crystal obtained was fixed to a seed rod and cooled down to 1156° C.; the seed crystal was lowered from the top of the crystal growth furnace into a hearth, first preheated for 10 minutes above the liquid surface, then lowered into the mixed melt for meltback, kept at a constant temperature for 3 minutes, then rapidly cooled to 1150° C., and slowly cooled at a rate of 1° C./d; the seed rod was rotated at a rotation speed of 5 r/min to ensure good growth of the crystal while pulling the crystal up at a speed of 0.5 mm/h; after the diameter of the crystal reaches a desired size, the rotation and pulling are stopped, and the temperature was slowly lowered at a rate 0.5° C./d; after the crystal grew to a desired size, the crystal was lifted off the surface of the mixed melt and cooled to the room temperature at a cooling rate of 10° C./h, and taken out from the hearth to obtain a calcium metaborate birefringent crystal with a size of 55×45×62 mm³.

Embodiment 7

Growth of a calcium metaborate birefringent crystal by a melt pulling method:

A calcium metaborate birefringent crystal was prepared according to a chemical equation $Ca(OH)_2+B_2O_3 \rightarrow CaB_2O_4+H_2O\uparrow$, using raw materials $Ca(OH)_2$ and $B_2O_3$ which were analytically pure (larger than or equal to 99%):

$Ca(OH)_2$ and $B_2O_3$ were directly mixed uniformly with a molar ratio of calcium to boron of 1:2, fully ground, put into a platinum crucible, and slowly heated to a temperature of 1160° C., and the temperature was kept constant for 30 hours to obtain a mixed melt;

preparation of a calcium metaborate seed crystal: a platinum wire fixed at a lower end of a seed rod was lowered into the mixed melt obtained, and slowly cooled down at a rate of 1° C./h until a crystal appeared on the platinum wire; then the seed rod was rotated at a rotation rate of 0 r/min, and slowly cooled down at a rate of 0.1° C./d while pulling the crystal up at a speed of 2 mm/h; and after the crystal is grown to a desired size, the crystal was lifted off the liquid surface, and cooled to the room temperature at a cooling rate of 10° C./h, to obtain a calcium metaborate seed crystal; and the crucible containing the mixed melt prepared was placed into a crystal growth furnace; the seed crystal obtained was fixed to a seed rod and cooled down to 1153° C.; the seed crystal was lowered from the top of the crystal growth furnace into a hearth, first preheated for 10 minutes above the liquid surface, then brought into contact with the surface of the mixed melt for meltback, kept at a constant temperature for 3 minutes, rapidly cooled to 1145° C., and slowly cooled at a rate of 0.1° C./d; the seed rod was rotated at a rotation speed of 2 r/min to ensure good growth of the crystal while pulling the crystal up at a speed of 0.2 mm/h; and after the crystal grew to a desired size, the crystal was lifted off the surface of the mixed melt and cooled to the room temperature at a cooling rate of 5° C./h, and taken out from the hearth to obtain a calcium metaborate birefringent crystal with a size of 26×18×31 mm³.

Embodiment 8

Growth of a calcium metaborate birefringent crystal by a flux method:

A calcium metaborate birefringent crystal was prepared according to a chemical equation $CaC_2O_4+2H_3BO_3 \rightarrow CaB_2O_4+CO_2\uparrow+H_2O\uparrow$, using raw materials $CaC_2O_4$ and $H_3BO_3$ which were analytically pure (larger than or equal to 99%):

$CaC_2O_4$ and $H_3BO_3$ were uniformly mixed with a molar ratio of calcium to boron of 1:2 and thoroughly ground; then the mixture was pre-sintered in a corundum crucible at a temperature of 300° C. for 4 hours, taken out and compacted, then heated to a temperature of 900° C., and kept at the temperature for 2 days to obtain polycrystalline powder of a calcium metaborate compound; and X-ray analysis is performed on the powder, to obtain an X-ray spectrum consistent with that after a calcium metaborate single crystal was ground into powder;

the synthesized calcium metaborate compound and a melt $H_3BO_3$ (analytically pure, larger than or equal to 99%) were mixed uniformly with a molar ratio of $CaB_2O_4$:$H_3BO_3$ of 1:0.01, put into a platinum crucible, and heated to a temperature of 1160° C., and the temperature was kept constant for 50 hours to obtain a mixed melt;

preparation of a calcium metaborate seed crystal: the mixed melt obtained was rapidly cooled by 5° C., and kept at a corresponding temperature for 2 hours, and the process of cooling and heat preservation was repeated until a floating crystal appeared on the melt surface, and then the mixture was slowly cooled at a rate of 0.5° C./d until crystallization was completed, and the mixture was cooled to the room temperature at a cooling rate of 20° C./h, to obtain a calcium metaborate seed crystal by spontaneous crystallization;

the crucible containing the mixed melt prepared was placed into a crystal growth furnace; the seed crystal obtained was fixed to a seed rod and cooled down to 1150° C.; the seed crystal was lowered from the top of the crystal growth furnace into a hearth, first preheated for 10 minutes above the liquid surface, then lowered to contact the surface of the mixed melt for meltback, kept at a constant temperature for 1 minute, rapidly cooled to 1142° C., and slowly cooled at a rate of 1° C./d; the seed rod was rotated at a rotation speed of 15 r/min to ensure good growth of the crystal while pulling the crystal up at a speed of 3 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 11×14×39 mm$^3$.

Embodiment 9

Growth of a calcium metaborate birefringent crystal by a flux method:
A CaB2O4 crystal was prepared according to a chemical equation $Ca(CH_3COO)_2+H_3BO_3 \rightarrow CaB_2O_4+CO_2\uparrow+H_2O\uparrow$, using raw materials $Ca(CH_3COO)_2$ and $H_3BO_3$ which were analytically pure (larger than or equal to 99%):
$Ca(CH_3COO)_2$, $H_3BO_3$ and a melt LiOH were weighed and mixed uniformly with a molar ratio of calcium to boron to LiOH of 1:2:1, fully ground and directly put into a platinum crucible; and the mixture was slowly heated to a temperature of 1080° C., and the temperature was kept constant for 10 hours to obtain a mixed melt;
preparation of a calcium metaborate seed crystal: the mixed melt obtained was rapidly cooled by 10° C., and kept at a corresponding temperature for 6 hours, and the process was repeated until a floating crystal appeared on the melt surface, and then the mixture was slowly cooled at a rate of 5° C./d until crystallization, and cooled to the room temperature at a cooling rate of 20° C./h, to obtain a calcium metaborate seed crystal by spontaneous crystallization;
the crucible containing the mixed melt prepared was placed into a crystal growth furnace; the seed crystal obtained was fixed to a seed rod and cooled down to 1030° C.; the seed crystal was lowered from the top of the crystal growth furnace into a hearth, first preheated for 10 minutes above the liquid surface, then lowered into the mixed melt for meltback, kept at a constant temperature for 20 minutes, rapidly cooled to 1020° C., and slowly cooled at a rate of 3° C./d; the seed rod was rotated at a rotation speed of 0r/min while pulling the crystal up at a speed of 0 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 18×11×13 mm$^3$.

Embodiment 10

Growth of a calcium metaborate birefringent crystal by a flux method:
A calcium metaborate birefringent crystal was prepared according to a chemical equation $CaO+B_2O_3 \rightarrow CaB_2O_4$, using raw materials CaO and $B_2O_3$ which were analytically pure (larger than or equal to 99%):
CaO and $B_2O_3$ were uniformly mixed with a molar ratio of calcium to boron of 1:2 and thoroughly ground; then the mixture was pre-sintered in a corundum crucible at a temperature of 300° C. for 4 hours, taken out and compacted, then heated to a temperature of 900° C., and kept at the temperature for 2 days to obtain polycrystalline powder of a calcium metaborate compound; and X-ray analysis is performed on the powder, to obtain an X-ray spectrum consistent with that after a calcium metaborate single crystal was ground into powder;
the synthesized calcium metaborate compound and a melt $Li_2CO_3$ (analytically pure, larger than or equal to 99%) were mixed uniformly with a molar ratio of $CaB_2O_4$: $Li_2CO_3$ of 1:0.2, put into a platinum crucible, and heated to a temperature of 1150° C., and the temperature was kept constant for 10 hours to obtain a mixed melt;
preparation of a calcium metaborate seed crystal: a platinum wire fixed at a seed rod was lowered into the mixed melt obtained, and slowly cooled down at a rate of 1° C./h until a crystal appeared on the platinum wire; then the seed rod was rotated at a rotation rate of 5 r/min, and slowly cooled down at a rate of 0.1° C./d; and after the crystal is grown to a desired size, the crystal was lifted off the liquid surface, and cooled to the room temperature at a cooling rate of 20° C./h, to obtain a calcium metaborate seed crystal;
the crucible containing the mixed melt prepared was placed into a crystal growth furnace; the seed crystal obtained was fixed to a seed rod and cooled down to 1100° C.; the seed crystal was lowered from the top of the crystal growth furnace into a hearth, first preheated for 10 minutes above the mixed melt surface, then lowered to contact the surface of the mixed melt for meltback, kept at a constant temperature for 15 minutes, rapidly cooled to 1094° C., and slowly cooled at a rate of 1° C./d; the seed rod was rotated at a rotation speed of 15 r/min to ensure good growth of the crystal while pulling the crystal up at a speed of 0.2 mm/h; and after the crystal grew to a desired size, the crystal was lifted off the surface of the mixed melt and cooled to the room temperature at a cooling rate of 5° C./h, and taken out from the hearth to obtain a calcium metaborate birefringent crystal with a size of 15×16×19 mm$^3$.

Embodiment 11

Growth of a calcium metaborate birefringent crystal by a flux method:
A calcium metaborate birefringent crystal was prepared according to a chemical equation $Ca(NO_3)_2+B_2O_3 \rightarrow CaB_2O_4+NO_2\uparrow$, using raw materials $Ca(NO_3)_2$ and $B_2O_3$ which were analytically pure (larger than or equal to 99%):
$Ca(NO_3)_2$, $B_2O_3$ and an analytically pure (larger than or equal to 99%) flux LiF were directly weighed and mixed uniformly with a molar ratio of calcium to boron to LiF of 1:2:0.1, fully ground, put into a platinum crucible, and slowly heated to a temperature of 1160° C., and the temperature was kept constant for 30 hours to obtain a mixed melt;
preparation of a calcium metaborate seed crystal: a platinum wire fixed at a seed rod was put into the mixed melt obtained, and slowly cooled down at a rate of 5° C./h until a crystal appeared on the platinum wire; then the seed rod was rotated at a rotation rate of 10 r/min, and slowly cooled down at a rate of 1° C./d; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 1140° C.; the seed crystal was lowered from the top of the crystal growth furnace into a hearth, first preheated for 10 minutes above the liquid surface, then lowered into the mixed melt for meltback, kept at a constant temperature for 5 minutes, rapidly cooled to 1136° C., and slowly cooled at a rate of 0.5° C./d; the seed rod was rotated at a rotation speed of 10 r/min while pulling the crystal up at a speed of 2 mm/h; and after the crystal grew to a desired size, the crystal was lifted off the surface of the mixed melt and cooled to the room temperature at a cooling rate of 15° C./h, and taken out from the hearth to obtain a calcium metaborate birefringent crystal with a size of 16×21×37 mm$^3$.

Embodiment 12

Growth of a calcium metaborate birefringent crystal by a flux method:

analytically pure (larger than or equal to 99%) $CaB_2O_4$ and flux $B_2O_3$ were directly mixed uniformly with a molar ratio of $CaB_2O_4$:$B_2O_3$ of 1:0.2, fully ground, put into a platinum crucible, and slowly heated to a temperature of 1110° C., and the temperature was kept constant for 30 hours to obtain a mixed melt;

preparation of a calcium metaborate seed crystal: a platinum wire fixed at a lower end of a seed rod was immersed into the mixed melt obtained, and slowly cooled down at a rate of 3° C./h until a crystal appeared on the platinum wire; then the seed rod was rotated at a rotation rate of 0 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 1082° C.; the seed crystal was lowered from the top of the crystal growth furnace into a hearth, first preheated for 10 minutes above the liquid surface, then lowered to contact the surface of the mixed melt for meltback, kept at a constant temperature for 10 minutes, rapidly cooled to 1076° C., and slowly cooled at a rate of 0.1° C./d; the seed rod was rotated at a rotation speed of 2 r/min to ensure good growth of the crystal while pulling the crystal up at a speed of 0.1 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 22×15×19 mm$^3$.

Embodiment 13

Growth of a calcium metaborate birefringent crystal by a flux method:

A calcium metaborate birefringent crystal was prepared according to a chemical equation $Ca(CH_3COO)_2$+$B_2O_3 \rightarrow CaB_2O_4 + CO_2 \uparrow + H_2O \uparrow$, using raw materials $Ca(CH_3COO)_2$ and $B_2O_3$ which were analytically pure (larger than or equal to 99%):

$Ca(CH_3COO)_2$, $B_2O_3$ and an analytically pure (larger than or equal to 99%) flux $LiNO_3$ were directly weighed and mixed uniformly with a molar ratio of calcium to boron to $LiNO_3$ of 1:2:0.6, fully ground, put into a platinum crucible, and slowly heated to a temperature of 1080° C., and the temperature was kept constant for 40 hours to obtain a mixed melt;

preparation of a calcium metaborate seed crystal: a platinum wire fixed at a seed rod was put into the mixed melt obtained, and slowly cooled down at a rate of 5° C./h until a crystal appeared on the platinum wire; then the seed rod was rotated at a rotation rate of 30 r/min, and slowly cooled down at a rate of 1° C./d; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 1060° C.; the seed crystal was lowered from the top of the crystal growth furnace into a hearth, first preheated for 10 minutes above the liquid surface, lowered into the mixed melt for meltback, kept at a constant temperature for 3 minutes, rapidly cooled to 1056° C., and slowly cooled at a rate of 1.5° C./d; the seed rod was rotated at a rotation speed of 6 r/min while pulling the crystal up at a speed of 2 mm/h; and after the crystal grew to a desired size, the crystal was lifted off the surface of the mixed melt and cooled to the room temperature at a cooling rate of 15° C./h, and taken out from the hearth to obtain a calcium metaborate birefringent crystal with a size of 32×19×14 mm$^3$.

Embodiment 14

Growth of a calcium metaborate birefringent crystal by a flux method:

A calcium metaborate birefringent crystal was prepared according to a chemical equation $CaC_2O_4$+$B_2O_3 \rightarrow CaB_2O_4 + CO_2 \uparrow$, using raw materials $CaC_2O_4$ and $B_2O_3$ which were analytically pure (larger than or equal to 99%):

$CaC_2O_4$, $B_2O_3$ and an analytically pure (larger than or equal to 99%) flux $NaNO_3$ were directly weighed and mixed uniformly with a molar ratio of calcium to boron to $LiNO_3$ of 1:2:2, fully ground, put into a platinum crucible, and slowly heated to a temperature of 980° C., and the temperature was kept constant for 20 hours to obtain a mixed melt;

preparation of a calcium metaborate seed crystal: the mixed melt obtained was rapidly cooled by 8° C. every time, and kept at a corresponding temperature for 4 hours, and the process of cooling and heat preservation was repeated until a floating crystal appeared on the melt surface, and then the mixture was slowly cooled at a rate of 5° C./d until crystallization, and cooled to the room temperature at a cooling rate of 20° C./h, to obtain a calcium metaborate seed crystal by spontaneous crystallization;

the crucible containing the mixed melt prepared was placed into a crystal growth furnace; the seed crystal obtained was fixed to a seed rod and cooled down to 935° C.; the seed crystal was lowered from the top of the crystal growth furnace into a hearth, first preheated for 10 minutes above the liquid surface, then lowered to contact the mixed melt for meltback, kept at a constant temperature for 4 minutes, rapidly cooled to 930° C., and slowly cooled at a rate of 1° C./d; the seed rod was rotated at a rotation speed of 5 r/min to ensure good growth of the crystal while pulling the crystal up at a speed of 0.5 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 16×20×13 $mm^3$.

Embodiment 15

Growth of a calcium metaborate birefringent crystal by a flux method:
A calcium metaborate birefringent crystal was prepared according to a chemical equation $CaCO_3 + 2H_3BO_3 \rightarrow CaB_2O_4 + CO_2\uparrow + H_2O\uparrow$, using raw materials $CaCO_3$ and $H_3BO_3$ which were analytically pure (larger than or equal to 99%):
$CaCO_3$, $H_3BO_3$ and an analytically pure (larger than or equal to 99%) flux $Na_2CO_3$ were directly weighed and mixed uniformly with a molar ratio of calcium to boron to $Na_2CO_3$ of 1:2:0.5, fully ground, put into a platinum crucible, and slowly heated to a temperature of 1020° C., and the temperature was kept constant for 24 hours to obtain a mixed melt;
preparation of a calcium metaborate seed crystal: the mixed melt obtained was rapidly cooled by 6° C., and kept at a corresponding temperature for 3 hours, and the process of cooling and heat preservation was repeated until a floating crystal appeared on the melt surface, and then the mixture was slowly cooled at a rate of 2° C./d until crystallization, and cooled to the room temperature at a cooling rate of 15° C./h, to obtain a calcium metaborate seed crystal by spontaneous crystallization;
the crucible containing the mixed melt prepared was placed into a crystal growth furnace; the seed crystal obtained was fixed to a seed rod and cooled down to 1000° C.; the seed crystal was lowered from the top of the crystal growth furnace into a hearth, first preheated for 20 minutes above the liquid surface, then lowered to contact the surface of the mixed melt for meltback, kept at a constant temperature for 5 minutes, rapidly cooled to 996° C., and slowly cooled at a rate of 2° C./d; the seed rod was rotated at a rotation speed of 8 r/min while pulling the crystal up at a speed of 1 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 22×18×12 $mm^3$.

Embodiment 16

Growth of a calcium metaborate birefringent crystal by a flux method:
A calcium metaborate birefringent crystal was prepared according to a chemical equation $Ca(OH)_2 + H_3BO_3 \rightarrow CaB_2O_4 + H_2O\uparrow$, using raw materials $Ca(OH)_2$ and $H_3BO_3$ which were analytically pure (larger than or equal to 99%):
$Ca(OH)_2$, $H_3BO_3$ and an analytically pure (larger than or equal to 99%) flux NaOH were directly weighed and mixed uniformly with a molar ratio of calcium to boron to NaOH of 1:2:3, fully ground, put into a platinum crucible, and slowly heated to a temperature of 950° C., and the temperature was kept constant for 12 hours to obtain a mixed melt;
preparation of a calcium metaborate seed crystal: a platinum wire fixed at a lower end of a seed rod was immersed into the mixed melt obtained, and slowly cooled down at a rate of 4° C./h until a crystal appeared on the platinum wire; then the seed rod was rotated at a rotation rate of 25 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;
the crucible containing the mixed melt prepared was placed into a crystal growth furnace; the seed crystal obtained was fixed to a seed rod and cooled down to 935° C.; the seed crystal was lowered from the top of the crystal growth furnace into a hearth, first preheated for 10 minutes above the liquid surface, then lowered to contact the surface of the mixed melt for meltback, kept at a constant temperature for 3 minutes, rapidly cooled to 930° C., and slowly cooled at a rate of 1° C./d; the seed rod was rotated at a rotation speed of 10 r/min while pulling the crystal up at a speed of 0 mm/h; and after the crystal grew to a desired size, the crystal was lifted off the surface of the mixed melt and cooled to the room temperature at a cooling rate of 15° C./h, and taken out from the hearth to obtain a calcium metaborate birefringent crystal with a size of 29×19×17 $mm^3$.

Embodiment 17

Growth of a calcium metaborate birefringent crystal by a flux method:
A calcium metaborate birefringent crystal was prepared according to a chemical equation $CaCO_3 + B_2O_3 \rightarrow CaB_2O_4 + CO_2\uparrow$, using raw materials $CaCO_3$ and $B_2O_3$ which were analytically pure (larger than or equal to 99%):
$CaCO_3$, $B_2O_3$ and an analytically pure (larger than or equal to 99%) flux NaF were directly weighed and mixed uniformly with a molar ratio of calcium to boron to NaF of 1:2:4, fully ground, put into a platinum crucible, and slowly heated to a temperature of 900° C., and the temperature was kept constant for 12 hours to obtain a mixed melt;
preparation of a calcium metaborate seed crystal: a platinum wire fixed at a lower end of a seed rod was immersed into the mixed melt obtained, and slowly cooled down at a rate of 3° C./h until a crystal appeared on the platinum wire; then the seed rod was rotated at a rotation rate of 0 r/min, and slowly cooled down at a rate of 5° C./d; and after the crystal is grown to a desired size, the crystal was lifted off the liquid surface, and cooled to the room temperature at a cooling rate of 20° C./h, to obtain a calcium metaborate seed crystal;
the crucible containing the mixed melt prepared was placed into a crystal growth furnace; the seed crystal obtained was fixed to a seed rod and cooled down to 860° C.; the seed crystal was lowered from the top of the crystal growth furnace into a hearth, first preheated for 10 minutes above the liquid surface, then lowered to contact the surface of the mixed melt for meltback, kept at a constant temperature for 10 minutes, rapidly cooled to 853° C., and slowly cooled at a rate of 0.1° C./d; the seed rod was rotated at a rotation speed of 2 r/min to ensure good growth of the crystal while pulling the crystal up at a speed of 0.5 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 26×15×12 mm³.

Embodiment 18

Growth of a calcium metaborate birefringent crystal by a flux method:
A calcium metaborate birefringent crystal was prepared according to a chemical equation $Ca(OH)_2 + B_2O_3 \rightarrow CaB_2O_4 + H_2O\uparrow$, using raw materials $Ca(OH)_2$ and $B_2O_3$ which were analytically pure (larger than or equal to 99%):
$Ca(OH)_2$ and $B_2O_3$ were uniformly mixed with a molar ratio of calcium to boron of 1:2 and thoroughly ground; then the mixture was pre-sintered in a corundum crucible at a temperature of 300° C. for 4 hours, taken out and compacted, then heated to a temperature of 900° C., and kept at the temperature for 2 days to obtain polycrystalline powder of a calcium metaborate compound; and X-ray analysis is performed on the powder, to obtain an X-ray spectrum consistent with that after a calcium metaborate single crystal was ground into powder;
the synthesized calcium metaborate compound and an analytically pure (larger than or equal to 99%) composite flux $Li_2CO_3$—$B_2O_3$ were mixed uniformly with a molar ratio of $CaB_2O_4$:$Li_2CO_3$—$B_2O_3$ of 1:2, put into a platinum crucible, and heated to a temperature of 900° C., and the temperature was kept constant for 10 hours to obtain a mixed melt, wherein the molar ratio of the flux $Li_2CO_3$—$B_2O_3$ is 2:1;
preparation of a calcium metaborate seed crystal: a platinum wire fixed at a seed rod was put into the mixed melt obtained, and slowly cooled down at a rate of 3° C./h until a crystal appeared on the platinum wire; then the seed rod was rotated at a rotation rate of 0 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;
the crucible containing the mixed melt prepared was placed into a crystal growth furnace; the seed crystal obtained was fixed to a seed rod and cooled down to 850° C.; the seed crystal was lowered from the top of the crystal growth furnace into a hearth, first preheated for 10 minutes above the liquid surface, then lowered to contact the surface of the mixed melt for meltback, kept at a constant temperature for 10 minutes, rapidly cooled to 845° C., and slowly cooled at a rate of 0.5° C./d; the seed rod was rotated at a rotation speed of 2 r/min to ensure good growth of the crystal while pulling the crystal up at a speed of 1 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 14×13×21 mm³.

Embodiment 19

Growth of a calcium metaborate birefringent crystal by a flux method:
A calcium metaborate birefringent crystal was prepared according to a chemical equation $Ca(OH)_2 + B_2O_3 \rightarrow CaB_2O_4 + H_2O\uparrow$, using raw materials $Ca(OH)_2$ and $B_2O_3$ which were analytically pure (larger than or equal to 99%):
$Ca(OH)_2$ and $B_2O_3$ were uniformly mixed with a molar ratio of calcium to boron of 1:2 and thoroughly ground; then the mixture was pre-sintered in a corundum crucible at a temperature of 300° C. for 4 hours, taken out and compacted, then heated to a temperature of 900° C., and kept at the temperature for 2 days to obtain polycrystalline powder of a calcium metaborate compound; and X-ray analysis is performed on the powder, to obtain an X-ray spectrum consistent with that after a calcium metaborate single crystal was ground into powder;
the synthesized calcium metaborate compound and an analytically pure (larger than or equal to 99%) composite flux $Na_2CO_3$—$B_2O_3$ were weighed and mixed uniformly with a molar ratio of $CaB_2O_4$:$Na_2CO_3$—$B_2O_3$ of 1:1.5, put into a platinum crucible, and heated to a temperature of 920° C., and the temperature was kept constant for 10 hours to obtain a mixed melt, wherein the molar ratio of the flux $Na_2CO_3$—$B_2O_3$ is 2:1;
preparation of a calcium metaborate seed crystal: a platinum wire fixed at a seed rod was put into the mixed melt obtained, and slowly cooled down at a rate of 5° C./h until a crystal appeared on the platinum wire; then the seed rod was rotated at a rotation rate of 0 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;
the crucible containing the mixed melt prepared was placed into a crystal growth furnace; the seed crystal obtained was fixed to a seed rod and cooled down to 870° C.; the seed crystal was lowered from the top of the crystal growth furnace into a hearth, first preheated for 10 minutes above the liquid surface, then lowered to contact the surface of the mixed melt for meltback, kept at a constant temperature for 10 minutes, rapidly cooled to 862° C., and slowly cooled at a rate of 2° C./d; the seed rod was rotated at a rotation speed of 2 r/min to ensure good growth of the crystal while pulling the crystal at a speed of 0 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 24×17×11 mm³.

Embodiment 20

Growth of a calcium metaborate birefringent crystal by a flux method:
an analytically pure (larger than or equal to 99%) calcium metaborate compound and an analytically pure (larger than or equal to 99%) composite flux LiOH—$H_3BO_3$ were directly weighed and mixed uniformly with a molar ratio of $CaB_2O_4$:LiOH—$H_3BO_3$ of 1:1, put into a platinum crucible, and heated to a temperature of 950° C., and the temperature wad kept constant for 20 hours to obtain a mixed melt, wherein the molar ratio of the flux LiOH—$H_3BO_3$ is 3:1;

preparation of a calcium metaborate seed crystal: a platinum wire fixed at a seed rod was put into the mixed melt obtained, and slowly cooled down at a rate of 3° C./h until a crystal appeared on the platinum wire; then the seed rod was rotated at a rotation rate of 0 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 900° C.; the seed crystal was lowered from the top of the crystal growth furnace into a hearth, first preheated for 10 minutes above the liquid surface, then lowered to contact the surface of the mixed melt for meltback, kept at a constant temperature for 5 minutes, rapidly cooled to 894° C., and slowly cooled at a rate of 3° C./d; the seed rod was rotated at a rotation speed of 2 r/min to ensure good growth of the crystal while pulling the crystal up at a speed of 0.2 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 25×19×16 mm$^3$.

Embodiment 21

Growth of a calcium metaborate birefringent crystal by a flux method:

an analytically pure (larger than or equal to 99%) calcium metaborate compound and an analytically pure (larger than or equal to 99%) composite flux $LiF-H_3BO_3$ were directly weighed and mixed uniformly with a molar ratio of $CaB_2O_4$:$LiF-H_3BO_3$ of 1:3, put into a platinum crucible, and heated to a temperature of 900° C., and the temperature was kept constant for 20 hours to obtain a mixed melt, wherein the molar ratio of the flux $LiF-H_3BO_3$ is 2:1;

preparation of a calcium metaborate seed crystal: a platinum wire fixed at a seed rod was put into the mixed melt obtained, and slowly cooled down at a rate of 3° C./h until a crystal appeared on the platinum wire; then the seed rod was rotated at a rotation rate of 0 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 855° C.; the seed crystal was lowered from the top of the crystal growth furnace into a hearth, first preheated for 10 minutes above the liquid surface, then lowered to contact the surface of the mixed melt for meltback, kept at a constant temperature for 3 minutes, rapidly cooled to 848° C., and slowly cooled at a rate of 2° C./d; the seed rod was rotated at a rotation speed of 5 r/min to ensure good growth of the crystal while pulling the crystal up at a speed of 0.1 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 15×17×11 mm$^3$.

Embodiment 22

Growth of a calcium metaborate birefringent crystal by a flux method:

an analytically pure (larger than or equal to 99%) calcium metaborate compound and an analytically pure (larger than or equal to 99%) composite flux $NaOH-H_3BO_3$ were directly weighed and mixed uniformly with a molar ratio of $CaB_2O_4$:$NaOH-H_3BO_3$ of 1:1, put into a platinum crucible, and heated to a temperature of 1000° C., and the temperature was kept constant for 20 hours to obtain a mixed melt, wherein the molar ratio of the flux $NaOH-H_3BO_3$ is 2:1;

preparation of a calcium metaborate seed crystal: a platinum wire fixed at a seed rod was put into the mixed melt obtained, and slowly cooled down at a rate of 3° C./h until a crystal appeared on the platinum wire; then the seed rod was rotated at a rotation rate of 2 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 960° C.; the seed crystal was lowered from the top of the crystal growth furnace into a hearth, first preheated for 10 minutes above the liquid surface, then lowered to contact the surface of the mixed melt for meltback, kept at a constant temperature for 5 minutes, rapidly cooled to 954° C., and slowly cooled at a rate of 1.5° C./d; the seed rod was rotated at a rotation speed of 10 r/min to ensure good growth of the crystal while pulling the crystal at a speed of 0 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 25×29×13 mm$^3$.

Embodiment 23

Growth of a calcium metaborate birefringent crystal by a flux method:

an analytically pure (larger than or equal to 99%) calcium metaborate compound and an analytically pure (larger than or equal to 99%) composite flux $LiNO3$-$H3BO3$ were directly weighed and mixed uniformly with a molar ratio of $CaB_2O_4$:$LiNO_3-H_3BO_3$ of 1:2, put into a platinum crucible, and heated to a temperature of 970° C., and the temperature was kept constant for 20 hours to obtain a mixed melt, wherein the molar ratio of the flux $LiNO_3-H_3BO_3$ is 1:1;

preparation of a calcium metaborate seed crystal: a platinum wire fixed at a seed rod was put into the mixed melt obtained, and slowly cooled down at a rate of 3° C./h until a crystal appeared on the platinum wire; then the seed rod was rotated at a rotation rate of 0 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;

the crucible containing the mixed melt prepared was placed into a crystal growth furnace; the seed crystal obtained was fixed to a seed rod and cooled down to 930° C.; the seed crystal was lowered from the top of the crystal growth furnace into a hearth, first preheated for 10 minutes above the liquid surface, then lowered to contact the surface of the mixed melt for meltback, kept at a constant temperature for 5 minutes, rapidly cooled to 924° C., and slowly cooled at a rate of 2° C./d; the seed rod was rotated at a rotation speed of 8 r/min to ensure good growth of the crystal while pulling the crystal up at a speed of 0.1 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 21×18×14 mm$^3$.

Embodiment 24

Growth of a calcium metaborate birefringent crystal by a flux method:
an analytically pure (larger than or equal to 99%) calcium metaborate compound and an analytically pure (larger than or equal to 99%) composite flux $NaNO_3$—$H_3BO_3$ were directly weighed and mixed uniformly with a molar ratio of $CaB_2O_4$:$NaNO_3$—$H_3BO_3$ of 1:2, put into a platinum crucible, and heated to a temperature of 940° C., and the temperature was kept constant for 10 hours to obtain a mixed melt, wherein the molar ratio of the flux $NaNO_3$—$H_3BO_3$ is 2:1;
preparation of a calcium metaborate seed crystal: a platinum wire fixed at a seed rod was put into the mixed melt obtained, and slowly cooled down at a rate of 3° C./h until a crystal appeared on the platinum wire; then the seed rod was rotated at a rotation rate of 2 r/min, and slowly cooled down at a rate of 2° C./d; and after the crystal is grown to a desired size, the crystal was lifted off the liquid surface, and cooled to the room temperature at a cooling rate of 20° C./h, to obtain a calcium metaborate seed crystal;
the crucible containing the mixed melt prepared was placed into a crystal growth furnace; the seed crystal obtained was fixed to a seed rod and cooled down to 900° C.; the seed crystal was lowered from the top of the crystal growth furnace into a hearth, first preheated for 10 minutes above the liquid surface, then lowered to contact the surface of the mixed melt for meltback, kept at a constant temperature for 5 minutes, rapidly cooled to 894° C., and slowly cooled at a rate of 2° C./d; the seed rod was rotated at a rotation speed of 5 r/min to ensure good growth of the crystal while pulling the crystal up at a speed of 0.05 mm/h; and after the crystal grew to a desired size, the crystal was lifted off the surface of the mixed melt and cooled to the room temperature at a cooling rate of 20° C./h, and taken out from the hearth to obtain a calcium metaborate birefringent crystal with a size of 27×21×13 mm$^3$.

Embodiment 25

Growth of a calcium metaborate birefringent crystal by a Bridgman method:
analytically pure (larger than or equal to 99%) $CaB_2O_4$ and $B_2O_3$ were uniformly mixed with a molar ratio of calcium to boron of 1:2.02 and thoroughly ground; and then the mixture was pre-sintered in a corundum crucible at a temperature of 300° C. for 4 hours, taken out and compacted, then heated to a temperature of 900° C., and kept at the temperature for 2 days to obtain a mixed raw material for crystal growth;
preparation of a calcium metaborate seed crystal: the mixed raw material obtained was put into a platinum crucible for a Bridgman method; the crucible was placed into a temperature gradient furnace, and heated to a temperature of 1200° C. to completely melt the mixed raw material in the crucible, and the temperature was kept constant for 10 hours; then the crucible was lowered at a rate of 0.1 mm/h, so that the solution in the crucible slowly crystallized from bottom to top; and after the crystallization was completed, the crucible was cooled to the room temperature at a cooling rate of 20° C./h to obtain a calcium metaborate seed crystal;
the seed crystal was put into a seed well at the bottom of the crucible, and then the mixed raw material obtained was put into the crucible; the crucible was placed into a temperature gradient furnace, and heated to a temperature of 1160° C., and the temperature was kept constant for 20 hours, to completely melt the mixed raw material in the crucible and keep the seed crystal at the bottom in a crystalline state; then the crucible was lowered at a rate of 0.1 mm/h, so that the solution in the crucible slowly crystallized from bottom to top; and after the crystallization was completed, the crucible was cooled to the room temperature at a cooling rate of 20° C./h to obtain a calcium metaborate birefringent crystal with a size of Φ40×51 mm$^3$.

Embodiment 26

Growth of a calcium metaborate birefringent crystal by a Bridgman method:
A calcium metaborate birefringent crystal was prepared according to a chemical equation $CaCO_3 + B_2O_3 \rightarrow CaB_2O_4 + CO_2\uparrow$, using raw materials $CaCO_3$ and $B_2O_3$ which were analytically pure (larger than or equal to 99%):
analytically pure (larger than or equal to 99%) $CaCO_3$ and $B_2O_3$ were uniformly mixed with a molar ratio of calcium to boron of 1:2.1 and thoroughly ground; and then the mixture was pre-sintered in a corundum crucible at a temperature of 300° C. for 4 hours, taken out and compacted, then heated to a temperature of 900° C., and kept at the temperature for 2 days to obtain a mixed raw material for crystal growth;
preparation of a calcium metaborate seed crystal: the mixed raw material obtained was put into a platinum crucible for a Bridgman method; the crucible was placed into a temperature gradient furnace, and heated to a temperature of 1200° C. to completely melt the mixed raw material in the crucible, and the temperature was kept constant for 10 hours; then the crucible was lowered at a rate of 2 mm/h, so that the solution in the crucible slowly crystallized from bottom to top; and after the crystallization was completed, the crucible was cooled to the room temperature at a cooling rate of 20° C./h to obtain a calcium metaborate seed crystal;
the seed crystal was put into a seed well at the bottom of the crucible, and then the mixed raw material obtained was put into the crucible; the crucible was placed into a temperature gradient furnace, and heated to a temperature of 1150° C., and the temperature was kept constant for 10 hours, to completely melt the mixed raw material in the crucible and keep the seed crystal at the bottom in a crystalline state; then the crucible was lowered at a rate of 1 mm/h, so that the solution in the crucible slowly crystallized from bottom to top; and after the crystallization was completed, the crucible was cooled to the room temperature at a cooling rate of 10° C./h to obtain a calcium metaborate birefringent crystal with a size of $\Phi 40\times 46$ mm$^3$.

Embodiment 27

Growth of a calcium metaborate birefringent crystal by a Bridgman method:
an analytically pure (larger than or equal to 99%) calcium metaborate compound was pre-sintered in a corundum crucible at a temperature of 300° C. for 4 hours, taken out and compacted, then heated to a temperature of 900° C., and kept at the temperature for 2 days to obtain a sintered raw material for crystal growth;
preparation of a calcium metaborate seed crystal: the sintered raw material obtained was put into a platinum crucible for a Bridgman method; the crucible was placed into a temperature gradient furnace, and heated to a temperature of 1200° C. to completely melt the mixed raw material in the crucible, and the temperature was kept constant for 10 hours; then the crucible was lowered at a rate of 1 mm/h, so that the melt in the crucible slowly crystallizes from bottom to top; and after the crystallization was completed, the crucible was cooled to the room temperature at a cooling rate of 20° C./h to obtain a calcium metaborate seed crystal; the seed crystal was put into a seed well at the bottom of the crucible, and then the sintered raw material obtained was put into the crucible; the crucible was placed into a temperature gradient furnace, and heated to a temperature of 1180° C., and the temperature was kept constant for 1 hour, to completely melt the mixed raw material in the crucible and keep the seed crystal at the bottom in a crystalline state; then the crucible was lowered at a rate of 0.5 mm/h, so that the melt in the crucible slowly crystallizes from bottom to top; and after the crystallization was completed, the crucible was cooled to the room temperature at a cooling rate of 5° C./h to obtain a calcium metaborate birefringent crystal with a size of $\Phi 40\times 28$ mm$^3$.

Embodiment 28

Growth of a calcium metaborate birefringent crystal by a Bridgman method:
A calcium metaborate birefringent crystal was prepared according to a chemical equation $Ca(NO_3)_2 + B_2O_3 \rightarrow CaB_2O_4 + NO_2\uparrow$, using raw materials $Ca(NO_3)_2$ and $B_2O_3$ which were analytically pure (larger than or equal to 99%):
analytically pure (larger than or equal to 99%) $Ca(NO_3)_2$ and $B_2O_3$ were uniformly mixed with a molar ratio of calcium to boron of 1:2.01 and thoroughly ground; and then the mixture was pre-sintered in a corundum crucible at a temperature of 300° C. for 4 hours, taken out and compacted, then heated to a temperature of 900° C., and kept at the temperature for 2 days to obtain a mixed raw material for crystal growth;
preparation of a calcium metaborate seed crystal: the mixed raw material obtained was put into a platinum crucible for a Bridgman method; the crucible was placed into a temperature gradient furnace, and heated to a temperature of 1200° C. to completely melt the mixed raw material in the crucible, and the temperature was kept constant for 10 hours; then the crucible was lowered at a rate of 0.5 mm/h, so that the solution in the crucible slowly crystallized from bottom to top; and after the crystallization was completed, the crucible was cooled to the room temperature at a cooling rate of 20° C./h to obtain a calcium metaborate seed crystal; the seed crystal was put into a seed well at the bottom of the crucible, and then the mixed raw material obtained was put into the crucible; the crucible was placed into a temperature gradient furnace, and heated to a temperature of 1165° C., and the temperature was kept constant for 5 hours, to completely melt the mixed raw material in the crucible and keep the seed crystal at the bottom in a crystalline state; then the crucible was lowered at a rate of 0.3 mm/h, so that the solution in the crucible slowly crystallized from bottom to top; and after the crystallization was completed, the crucible was cooled to the room temperature at a cooling rate of 10° C./h to obtain a calcium metaborate birefringent crystal with a size of $\Phi 40\times 56$ mm$^3$.

Embodiment 29

Growth of a calcium metaborate birefringent crystal by a heat exchange method:
CaO and $B_2O_3$ were uniformly mixed with a molar ratio of calcium to boron of 1:2.01 and thoroughly ground; and then the mixture was pre-sintered in a corundum crucible at a temperature of 300° C. for 4 hours, taken out and compacted, then heated to a temperature of 900° C., and kept at the temperature for 2 days to obtain a mixed raw material for crystal growth;
preparation of a calcium metaborate seed crystal: the mixed raw material obtained was put into a platinum crucible for a heat exchange method, and the crucible was placed into a heat exchange furnace; the crucible was heated to a temperature of 1200° C. to completely melt the mixed raw material in the crucible, and the temperature was kept constant for 10 hours, and then the crucible was cooled at a rate of 1° C./h, so that the solution in the crucible slowly crystallized from bottom to top; and after the crystallization was completed, the crucible was cooled to the room temperature at a cooling rate of 20° C./h to obtain a calcium metaborate seed crystal;
the seed crystal was put into a seed well at the bottom of the platinum crucible, and then the mixed raw material obtained was put into the crucible, and heated to a temperature of 1170° C., and the temperature was kept constant for 6 hours, to completely melt the raw material in the crucible and keep the seed crystal at the bottom in a crystalline state; a temperature distribution in which the temperature fell from top to bottom was created through a heater, a reflective insulation screen and a seed rod cooling device; then cooling was performed at a rate of 0.5° C./h so that the melt in the crucible slowly crystallizes from bottom to top; and after the crystallization was completed, the crucible was cooled to the room temperature at a cooling rate of 5° C./h to obtain a calcium metaborate birefringent crystal with a size of $\Phi 60\times 30$ mm$^3$.

Embodiment 30

Growth of a calcium metaborate birefringent crystal by a heat exchange method:

CaCO$_3$ and B$_2$O$_3$ were uniformly mixed with a molar ratio of calcium to boron of 1:2.1 and thoroughly ground; and then the mixture was pre-sintered in a corundum crucible at a temperature of 300° C. for 4 hours, taken out and compacted, then heated to a temperature of 900° C., and kept at the temperature for 2 days to obtain a mixed raw material for crystal growth;

preparation of a calcium metaborate seed crystal: the mixed raw material obtained was put into a platinum crucible for a heat exchange method, and the crucible was placed into a heat exchange furnace; the crucible was heated to a temperature of 1200° C. to completely melt the mixed raw material in the crucible, and the temperature was kept constant for 10 hours, and then the crucible was cooled at a rate of 0.1° C./h, so that the solution in the crucible slowly crystallized from bottom to top; and after the crystallization was completed, the crucible was cooled to the room temperature at a cooling rate of 20° C./h to obtain a calcium metaborate seed crystal;

the seed crystal was put into a seed well at the bottom of the platinum crucible, and then the mixed raw material obtained was put into the crucible, and heated to a temperature of 1150° C., and the temperature was kept constant for 20 hours, to completely melt the raw material in the crucible and keep the seed crystal at the bottom in a crystalline state; a temperature distribution in which the temperature fell from top to bottom was created through a heater, a reflective insulation screen and a seed rod cooling device; then cooling was performed at a rate of 0.1° C./h so that the melt in the crucible slowly crystallizes from bottom to top; and after the crystallization was completed, the crucible was cooled to the room temperature at a cooling rate of 20° C./h to obtain a calcium metaborate birefringent crystal with a size of Φ60×28 mm$^3$.

Embodiment 31

Growth of a calcium metaborate birefringent crystal by a heat exchange method:

an analytically pure (larger than or equal to 99%) calcium metaborate compound was pre-sintered in a corundum crucible at a temperature of 300° C. for 4 hours, taken out and compacted, then heated to a temperature of 900° C., and kept at the temperature for 2 days to obtain a mixed raw material for crystal growth;

preparation of a calcium metaborate seed crystal: the mixed raw material obtained was put into a platinum crucible for a heat exchange method, and the crucible was placed into a heat exchange furnace; the crucible was heated to a temperature of 1200° C. to completely melt the mixed raw material in the crucible, and the temperature was kept constant for 10 hours, and then the crucible was cooled at a rate of 0.5° C./h, so that the melt in the crucible slowly crystallizes from bottom to top; and after the crystallization was completed, the crucible was cooled to the room temperature at a cooling rate of 20° C./h to obtain a calcium metaborate seed crystal;

the seed crystal was put into a seed well at the bottom of the platinum crucible, and then the mixed raw material obtained was put into the crucible, and heated to a temperature of 1180° C., and the temperature was kept constant for 1 hour, to completely melt the raw material in the crucible and keep the seed crystal at the bottom in a crystalline state; a temperature distribution in which the temperature fell from top to bottom was created through a heater, a reflective insulation screen and a seed rod cooling device; then cooling was performed at a rate of 0.2° C./h so that the melt in the crucible slowly crystallizes from bottom to top; and after the crystallization was completed, the crucible was cooled to the room temperature at a cooling rate of 15° C./h to obtain a calcium metaborate birefringent crystal with a size of Φ60×35 mm$^3$.

Embodiment 32

Growth of a calcium metaborate birefringent crystal by a heat exchange method:

A calcium metaborate birefringent crystal was prepared according to a chemical equation Ca(NO$_3$)$_2$+B$_2$O$_3$→CaB$_2$O$_4$+NO$_2$↑, using raw materials Ca(NO$_3$)$_2$ and B$_2$O$_3$ which were analytically pure (larger than or equal to 99%):

Ca(NO$_3$)$_2$ and B$_2$O$_3$ were uniformly mixed with a molar ratio of calcium to boron of 1:2.06 and thoroughly ground; and then the mixture was pre-sintered in a corundum crucible at a temperature of 300° C. for 4 hours, taken out and compacted, then heated to a temperature of 900° C., and kept at the temperature for 2 days to obtain a mixed raw material for crystal growth;

preparation of a calcium metaborate seed crystal: the mixed raw material obtained was put into a platinum crucible for a heat exchange method, and the crucible was placed into a heat exchange furnace; the crucible was heated to a temperature of 1200° C. to completely melt the mixed raw material in the crucible, and the temperature was kept constant for 10 hours, and then the crucible was cooled at a rate of 0.6° C./h, so that the solution in the crucible slowly crystallized from bottom to top; and after the crystallization was completed, the crucible was cooled to the room temperature at a cooling rate of 20° C./h to obtain a calcium metaborate seed crystal;

the seed crystal was put into a seed well at the bottom of the platinum crucible, and then the mixed raw material obtained was put into the crucible, and heated to a temperature of 1165° C., and the temperature was kept constant for 10 hours, to completely melt the raw material in the crucible and keep the seed crystal at the bottom in a crystalline state; a temperature distribution in which the temperature fell from top to bottom was created through a heater, a reflective insulation screen and a seed rod cooling device; then cooling was performed at a rate of 0.3° C./h so that the solution in the crucible slowly crystallized from bottom to top; and after the crystallization was completed, the crucible was cooled to the room temperature at a cooling rate of 10° C./h to obtain a calcium metaborate birefringent crystal with a size of Φ60×20 mm$^3$.

Embodiment 33

Figure 3:
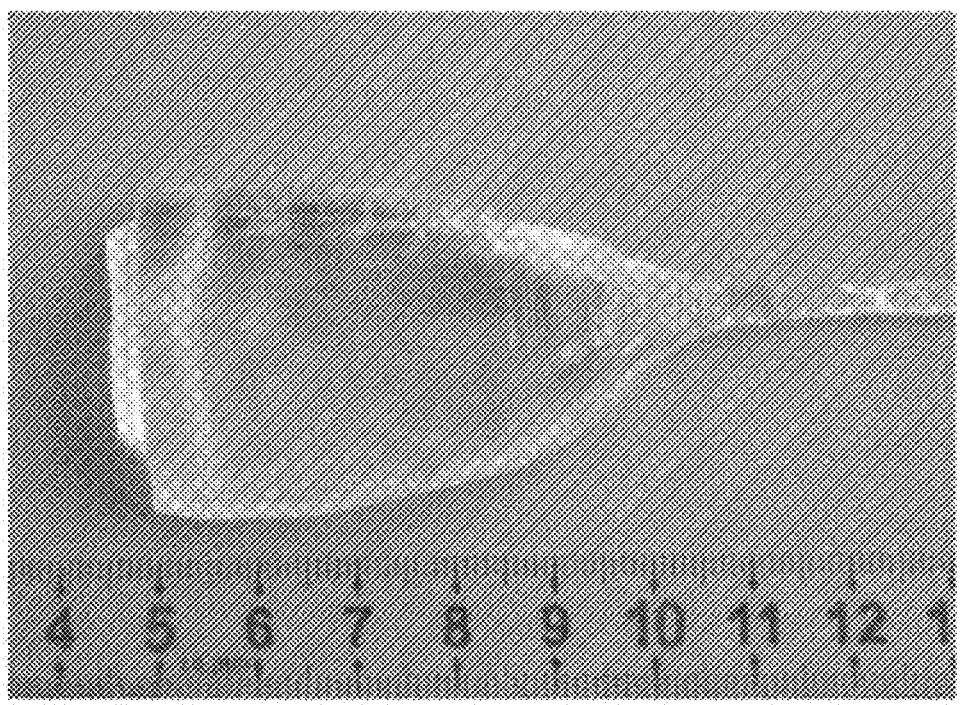
FIG. 3 shows a photograph of a calcium metaborate birefringent crystal for infrared-visible-ultraviolet-deep ultraviolet bands.
Figure 4:
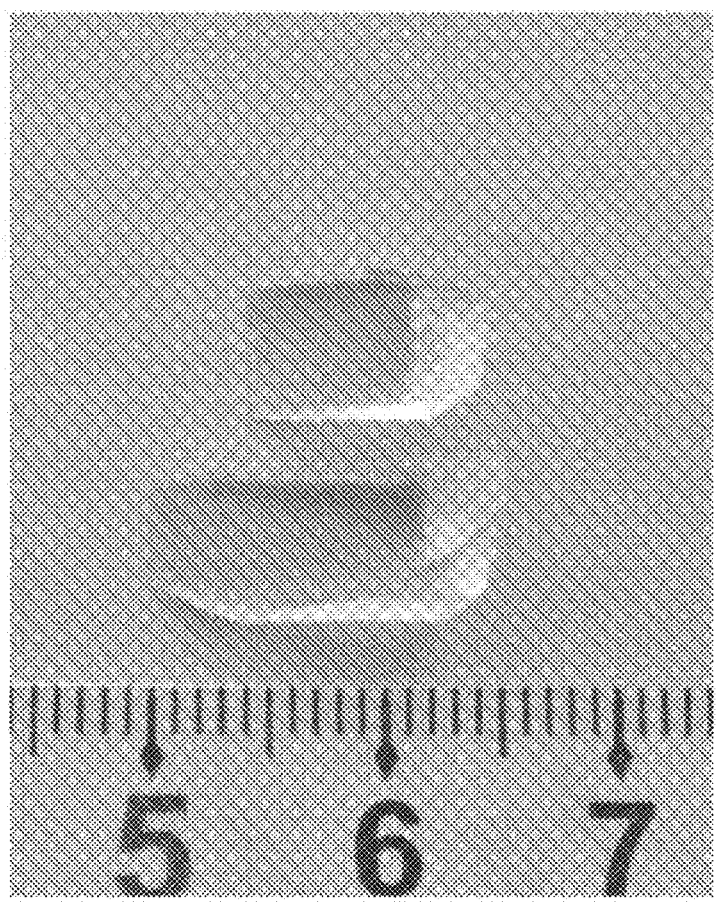
FIG. 4 shows a photograph of a prism for determining the refractive index of a calcium metaborate birefringent crystal by a minimum deflection angle method.

The calcium metaborate birefringent crystal prepared in Embodiment 1 (see FIG. 3) was cut into two prisms having different crystallographic axes (see FIG. 4), and the prisms were subjected to a refractive index test using a minimum deflection angle method. Experimental data at 13 wavelengths were fitted to form a dispersion equation (sellmier equation) of the calcium metaborate birefringent crystal:

$n_x^2=2.37133+0.01162/(\lambda^2-0.01232)-0.00851\lambda^2$, $n_y^2=2.69754+0.01739/(\lambda^2-0.01315)-0.01444\lambda^2$, $n_z^2=2.78837+0.01840/(\lambda^2-0.01774)-0.02013\lambda^2$;

the refractive index of the crystal in a light transmission wavelength range of 165-3400 nm was calculated according to the equation, and the difference between the corresponding maximum refractive index and minimum refractive index was the birefringence of the crystal.

Embodiment 34

Figure 5:
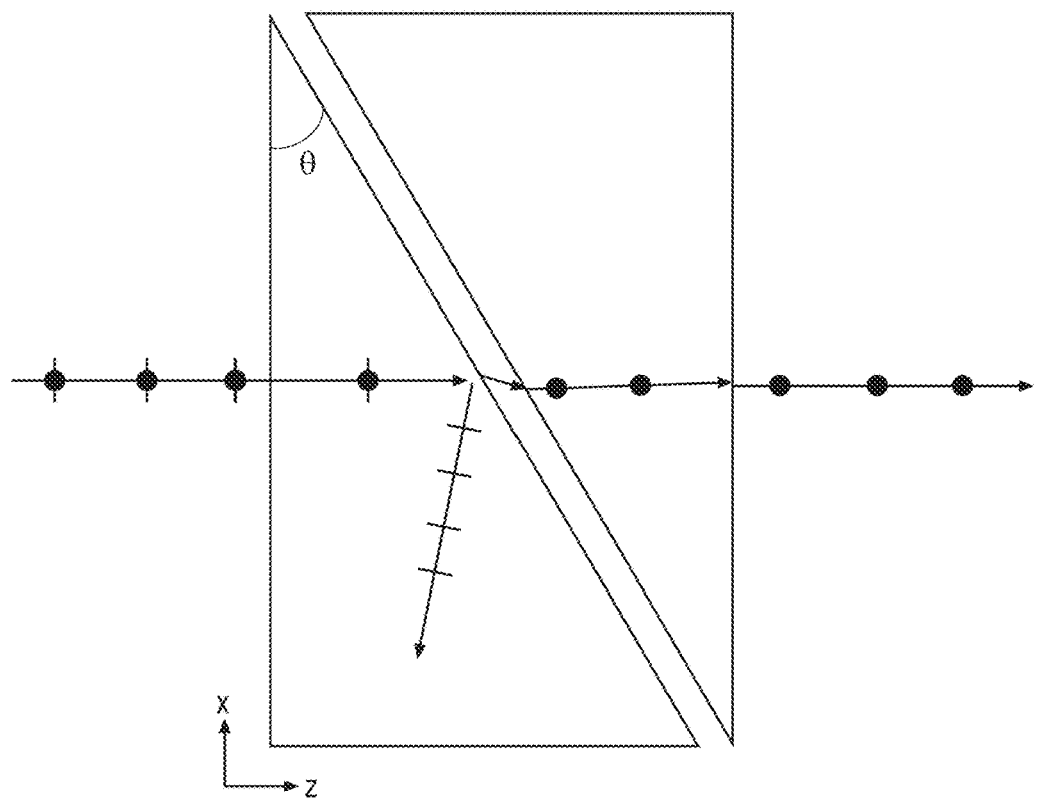
FIG. 5 shows a schematic diagram of a Glan prism for infrared-visible-ultraviolet-deep ultraviolet bands made of the crystal obtained in the present invention.

A Glan prism was produced using the calcium metaborate birefringent crystal of the present invention:
The calcium metaborate birefringent crystal obtained in any of Embodiments 1-32 was processed into two identical crystal prisms. As shown in FIG. 5, a vertical incidence direction of light was along a crystallographic axis of the crystal, and two other crystallographic axes were present in an incident face. The two prisms were connected together along an bevel face by a thin layer of air; or a connecting layer between the two prisms was changed from air to an optical cement with a different refractive index, thereby obtaining a polarizing prism cut with a different apex angle, and by adjusting the apex angle of the prism, a prism design of 165-3400 nm within a transparent transmission band of the crystal could be achieved. When a beam of light is was incident perpendicularly to the incident face, it passed through the first prism of the Glan prism, and two beams of light with polarization directions perpendicular to each other were not deflected. An incident angle on the bevel face was equal to an included angle (i.e. the apex angle of the prism) between the bevel face of the prism and a right angle plane. A suitable prism apex angle was selected so that one beam of polarized light was totally reflected on the bevel face, and the other beam of polarized light was emergent after passing through the connecting layer of the two prisms and the second prism.

Embodiment 35

Figure 6:
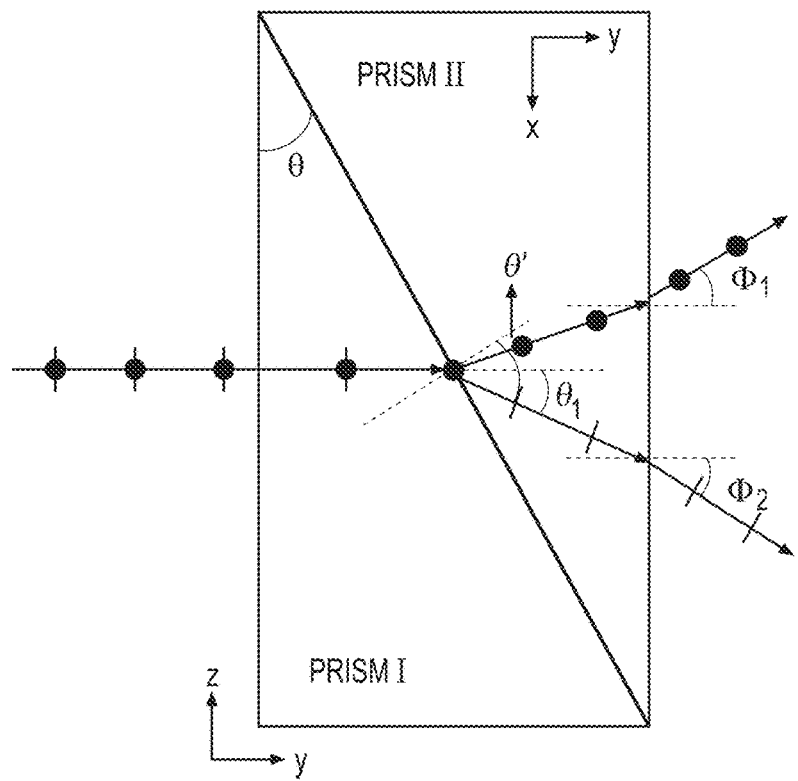
FIG. 6 shows a schematic diagram of a Wollaston prism for infrared-visible-ultraviolet-deep ultraviolet bands made of the crystal obtained in the present invention.

A Wollaston prism was produced using the calcium metaborate birefringent crystal of the present invention:
The calcium metaborate birefringent crystal obtained in any of Embodiments 1-32 was processed into two prisms and then bonded to form a Wollaston prism as shown in FIG. 6. The two prisms had same apex angles but different crystallographic axes at an incident face and an emergent face. Incident light was incident perpendicularly to an end face of the prism. In the first prism, two beams of polarized light whose polarization directions were perpendicular to each other traveled in the same direction at different speeds. When the light enters the second prism from the first prism, as the crystallographic axis was rotated by 90 degrees along the incident direction, the refractive index changed, and the two beams of linearly polarized light were subjected to birefringence respectively and thus separated. When entering the air from the second prism, the two separate beams of polarized light were subjected to second-time birefringence and thus further separated. The higher the birefringence of the crystal, the more favorable it was for separation of the beams.

Embodiment 36

Figure 7:
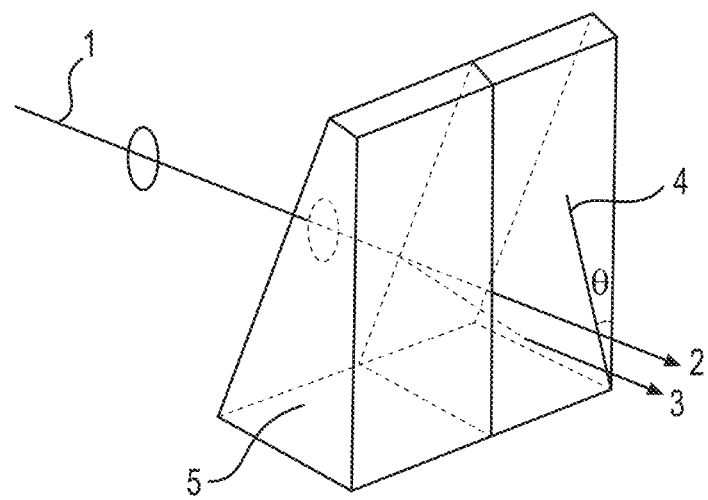
FIG. 7 shows a schematic diagram of a wedge-shaped birefringent crystal polarization beam splitter for infrared-visible-ultraviolet-deep ultraviolet bands made of the crystal obtained in the present invention.

A polarization beam splitter was produced using the calcium metaborate birefringent crystal of the present invention:
The calcium metaborate birefringent crystal obtained in any of Embodiments 1-30 was used to prepare a wedge-shaped birefringent crystal polarization beam splitter (as shown in FIG. 7). A wedge-shaped birefringent crystal was passed through along a y-axis direction of the crystal. A beam of natural light was incident along the direction of the y-axis as an optical main axis, then passed through the crystal and can be divided into two beams of linearly polarized light. The larger the birefringence, the farther the two beams can be separated, which facilitated separation of the beams.

Embodiment 37

Figure 8A:
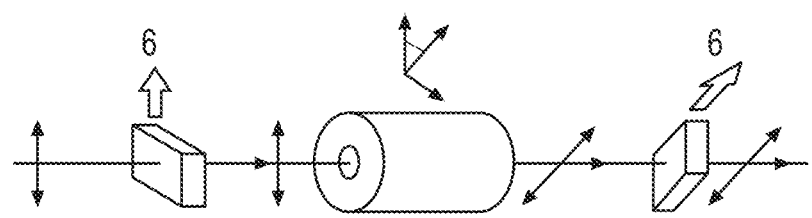
FIGS. 8A and 8B show a schematic diagram of an optical isolator for infrared-visible-ultraviolet-deep ultraviolet bands made of the crystal obtained in the present invention.
Figure 8B:
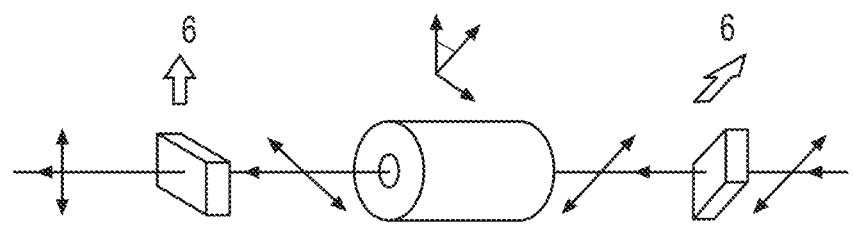

An optical isolator was produced using the calcium metaborate birefringent crystal of the present invention:
The calcium metaborate birefringent crystal obtained in any of Embodiments 1-32 was used to prepare an optical isolator. A Faraday optical rotator that rotated a plane of polarization of an incident beam by 45° was placed between a pair of birefringent crystal deflectors placed at 45° intersection with each other, thus forming an optical isolator, which only allowed a forward propagating beam to pass through the system and blocked a reverse propagating beam. FIG. 8A shows an incident beam can pass, and FIG. 8B shows reflected light was blocked.

The invention claimed is:
1. A preparation method of a calcium metaborate birefringent crystal having a chemical formula of $CaB_2O_4$ and a molecular weight of 125.70, and belonging to the orthorhombic crystal system and space group Pbcn with unit-cell parameters a=11.60(4)Å, b=4.28(8)Å, c=6.21(6)Å, and Z=4, wherein the calcium metaborate birefringent crystal is a negative biaxial crystal with a transmission range of 165-3400 nm and a birefringence between 0.09-0.36, wherein the preparation method is a melt method, a flux method, a Bridgman method or a heat exchange method;
the preparation of the calcium metaborate birefringent crystal using the melt method is specifically operated in the following steps:
a. mixing a calcium-containing compound and a boron-containing compound with a molar ratio of calcium to boron of 1:2 and grinding the same, then pre-sintering the mixture in a corundum crucible at a temperature of 300° C. for 4 hours, taking out and compacting the mixture, then raising the temperature to 900° C., keeping the temperature for 1-3 days to obtain polycrystalline powder of a calcium metaborate compound, and performing X-ray analysis on the powder, to obtain an X-ray spectrum consistent with that after a calcium metaborate single crystal is ground into powder; and then putting the obtained polycrystalline powder of the calcium metaborate compound into a platinum crucible, heating the powder to a temperature of 1160-1180° C., and keeping the temperature constant for 1-50 hours to obtain a mixed melt;
or directly mixing a calcium-containing compound and a boron-containing compound with a molar ratio of cal- cium to boron of 1:2, grinding the mixture and putting the same into a platinum crucible, slowly heating the mixture to a temperature of 1160-1180° C., and keeping the temperature constant for 10-50 hours to obtain a mixed melt;

wherein the calcium-containing compound is calcium oxide, calcium hydroxide, calcium carbonate, calcium nitrate, calcium acetate, calcium oxalate or calcium metaborate, and the boron-containing compound is boric acid, boron oxide or calcium metaborate;

b. preparing a calcium metaborate seed crystal: rapidly cooling the mixed melt obtained in step a by 5-10° C., keeping a corresponding temperature for 2-6 hours, repeating the process of cooling and heat preservation until a floating crystal appears on the liquid surface, then slowly cooling down at a rate of 0.1-5° C./d until crystallization is completed, and then cooling to the room temperature at a cooling rate of 20° C./h, to obtain a calcium metaborate seed crystal by spontaneous crystallization;

or immersing a platinum wire fixed at a lower end of a seed rod into the mixed melt obtained in step a, slowly cooling down at a rate of 1-5° C./h until a crystal appears on the platinum wire, then rotating the seed rod at a rotation rate of 0-30 r/min, slowly cooling down at a rate of 0.1-5° C./d while pulling the crystal up at a speed of 0-3 mm/h, and after the crystal is grown to a desired size, lifting the same off the liquid surface, and cooling to the room temperature at a cooling rate of 20° C./h, to obtain a calcium metaborate seed crystal; and c. placing the crucible containing the mixed melt prepared in step a into a crystal growth furnace, fixing the seed crystal obtained in step b to a seed rod, cooling down to 1152-1158° C., lowering the seed crystal from the top of the crystal growth furnace into a hearth, first preheating the seed crystal for 10 minutes above the mixed melt, then lowering the seed crystal onto the surface of the melt or into the melt for meltback, keeping a constant temperature for 1-20 minutes, then rapidly cooling to 1145-1150° C., and slowly cooling at a rate of 0.1-5° C./d, rotating the seed rod at a rotation speed of 0-30r/min while pulling the crystal up at a speed of 0-3 mm/h, carrying out a necking and shouldering process to optimize the crystal quality, and after the crystal grows to a desired size, lifting the crystal off the liquid surface and cooling to the room temperature at a cooling rate of 5-20° C./h, and taking out the crystal from the hearth to obtain a centimeter-sized calcium metaborate birefringent crystal;

the preparation of the calcium metaborate birefringent crystal using the flux method is specifically operated in the following steps:

a. mixing a calcium-containing compound and a boron-containing compound with a molar ratio of calcium to boron of 1:2 and grinding the same, then pre-sintering the mixture in a corundum crucible at a temperature of 300° C. for 4 hours, taking out and compacting the mixture, then raising the temperature to 900° C., keeping the temperature for 1-3 days to obtain polycrystalline powder of a calcium metaborate compound, and performing X-ray analysis on the powder, to obtain an X-ray spectrum consistent with that after a calcium metaborate single crystal is ground into powder; and then mixing the obtained polycrystalline powder of the calcium metaborate compound and a flux and putting the mixture into a platinum crucible, heating the mixture to a temperature of 900-1160° C., and keeping the temperature constant for 1-50 hours to obtain a mixed solution containing the flux, wherein the molar ratio of the calcium metaborate compound to the flux is 1:0.01-4;

or directly weighing and mixing a calcium-containing compound, a boron-containing compound and a flux with a molar ratio of Ca:B:flux of 1:2:0.01-4, grinding the mixture and putting the same into a platinum crucible, slowly heating the mixture to a temperature of 900-1160° C., and keeping the temperature constant for 10-50 hours to obtain a mixed solution containing the flux;

wherein the calcium-containing compound is calcium oxide, calcium hydroxide, calcium carbonate, calcium nitrate, calcium acetate, calcium oxalate or calcium metaborate; the boron-containing compound is boric acid, boron oxide or calcium metaborate; the flux is boron oxide, boric acid, sodium carbonate, sodium hydroxide, sodium fluoride, sodium nitrate, lithium fluoride, lithium hydroxide, lithium carbonate, lithium nitrate, or a mixture of a lithium-containing compound and a boron-containing compound, or a mixture of a sodium-containing compound and a boron-containing compound; wherein the molar ratio of lithium to boron in the mixture of the lithium-containing compound and the boron-containing compound is Li:B of 1-3:1, and the molar ratio of sodium to boron in the mixture of the sodium-containing compound and the boron-containing compound is Na:B of 1-3:1;

b. preparing a calcium metaborate seed crystal: rapidly cooling the mixed solution containing the flux obtained in step a by 5-10° C., keeping a corresponding temperature for 2-6 hours, repeating the process of cooling and heat preservation until a floating crystal appears on the liquid surface, then slowly cooling down at a rate of 0.1-5° C./d until crystallization is completed, and then cooling to the room temperature at a cooling rate of 20° C./h, to obtain a calcium metaborate seed crystal by spontaneous crystallization;

or immersing a platinum wire fixed at a lower end of a seed rod into the mixed solution containing the flux obtained in step a, slowly cooling down at a rate of 1-5° C./h until a crystal appears on the platinum wire, then rotating the seed rod at a rotation rate of 0-30 r/min, slowly cooling down at a rate of 0.1-5° C./d, and after the crystal is grown to a desired size, lifting the same off the liquid surface, and cooling to the room temperature at a cooling rate of 20° C./h, to obtain a calcium metaborate seed crystal; and c. placing the crucible containing the mixed solution prepared in step a into a crystal growth furnace, fixing the seed crystal obtained in step b to a seed rod, cooling down to 850-1150° C., lowering the seed crystal from the top of the crystal growth furnace into a hearth, first preheating the seed crystal for 10 minutes above the surface of the mixed solution, then lowering the seed crystal onto the surface of the liquid or into the liquid for meltback, keeping a constant temperature for 1-20 minutes, then rapidly cooling to 845-1145° C., and slowly cooling at a rate of 0.1-5° C./d, rotating the seed rod at a rotation speed of 0-30r/min while pulling the crystal up at a speed of 0-3 mm/h, and after the crystal grows to a desired size, lifting the crystal off the liquid surface and cooling to the room temperature at a cooling rate of 5-20° C./h, and taking out the crystal from the hearth to obtain a centimeter-sized calcium metaborate birefringent crystal;

the preparation of the calcium metaborate birefringent crystal using the Bridgman method is specifically operated in the following steps:
a. mixing a calcium-containing compound and a boron-containing compound with a molar ratio of calcium to boron of 1:2-2.1 and grinding the same, then pre-sintering the mixture in a corundum crucible at a temperature of 300° C. for 4 hours, taking out and compacting the mixture, then raising the temperature to 900° C., keeping the temperature for 2 days to obtain a mixed raw material for crystal growth; wherein the calcium-containing compound is calcium oxide, calcium hydroxide, calcium carbonate, calcium nitrate, calcium acetate, calcium oxalate or calcium metaborate, and the boron-containing compound is boric acid, boron oxide or calcium metaborate;
b. preparing a calcium metaborate seed crystal: putting the mixed raw material obtained in step a into a platinum crucible for a Bridgman method, placing the crucible into a temperature gradient furnace, and heating the same to a temperature of 1200° C. to completely melt the mixed raw material in the crucible, keeping the temperature constant for 10 hours, then lowering the crucible at a rate of 0.1-2 mm/h, so that the melt or solution in the crucible slowly crystallizes from bottom to top, and after the crystallization is completed, cooling to the room temperature at a cooling rate of 20° C./h to obtain a calcium metaborate seed crystal; and
c. putting the seed crystal into a seed well at the bottom of the platinum crucible for the Bridgman method, then putting the mixed raw material obtained in step a into the crucible, placing the crucible into a temperature gradient furnace, heating the same to a temperature of 1150-1180° C., keeping the temperature constant for 1-20 hours, to completely melt the mixed raw material in the crucible and keep the seed crystal at the bottom in a crystalline state, then lowering the crucible at a rate of 0.1-2 mm/h, so that the melt or solution in the crucible slowly crystallizes from bottom to top, and after the crystallization is completed, cooling to the room temperature at a cooling rate of 5-20° C./h to obtain a centimeter-sized calcium metaborate single crystal;

the preparation of the calcium metaborate birefringent crystal using the heat exchange method is specifically operated in the following steps:
a. mixing a calcium-containing compound and a boron-containing compound with a molar ratio of calcium to boron of 1:2-2.1 and grinding the same, then pre-sintering the mixture in a corundum crucible at a temperature of 300° C. for 4 hours, taking out and compacting the mixture, then raising the temperature to 900° C., keeping the temperature for 2 days to obtain a mixed raw material for crystal growth; wherein the calcium-containing compound is calcium oxide, calcium hydroxide, calcium carbonate, calcium nitrate, calcium acetate, calcium oxalate or calcium metaborate, and the boron-containing compound is boric acid, boron oxide or calcium metaborate;
b. preparing a calcium metaborate seed crystal: putting the mixed raw material obtained in step a into a platinum crucible for a heat exchange method, placing the crucible into a heat exchange furnace, heating the same to a temperature of 1200° C. to completely melt the mixed raw material in the crucible, keeping the temperature constant for 10 hours, then cooling down at a rate of 0.1-1° C./h, so that the melt or solution in the crucible slowly crystallizes from bottom to top, and after the crystallization is completed, cooling to the room temperature at a cooling rate of 20° C./h to obtain a calcium metaborate seed crystal; and
c. putting the seed crystal into a seed well at the bottom of the platinum crucible for the heat exchange method, then putting the mixed raw material obtained in step a into the crucible, heating the same to a temperature of 1150-1180° C., keeping the temperature constant for 1-20 hours, to completely melt the raw material in the crucible and keep the seed crystal at the bottom in a crystalline state, creating a temperature distribution in which the temperature falls from top to bottom through a heater, a reflective insulation screen and a seed rod cooling device, then cooling at a rate of 0.1-1° C./h so that the melt in the crucible slowly crystallizes from bottom to top, and after the crystallization is completed, cooling to the room temperature at a cooling rate of 5-20° C./h to obtain a centimeter-sized calcium metaborate single crystal.

2. The preparation method of the calcium metaborate birefringent crystal of claim 1, wherein the melt method is used and comprises a melt top seeded method, a melt pulling method and a Kyropoulos method.

3. The preparation method of the calcium metaborate birefringent crystal of claim 1, wherein the purities of the calcium-containing compound and the boron-containing compound are larger than or equal to 99.0%.

4. The preparation method of the calcium metaborate birefringent crystal of claim 1, wherein the purity of the flux is larger than or equal to 99.0%.

5. The preparation method of the calcium metaborate birefringent crystal of claim 1, which is the melt method.

6. The preparation method of the calcium metaborate birefringent crystal of claim 1, which is the flux method.

7. The preparation method of the calcium metaborate birefringent crystal of claim 1, which is the Bridgman method.

8. The preparation method of the calcium metaborate birefringent crystal of claim 1, which is the heat exchange method.

9. A method comprising preparing a multi-band optical element with the calcium metaborate birefringent crystal prepared by the preparation method of claim 1.

10. The method of claim 9, wherein the multi-band optical element is a polarizing beam-splitting prism such as Glan prism, Wollaston prism, Rochon prism, Nicol prism or Senarmont prism.

11. The method of claim 9, wherein the multi-band optical element is a polarization beam splitter, optical isolator, circulator, beam displacer, optical polarizer, optical polarization analyzer, optical polarization apparatus, optical modulator, polarization beam splitter, phase delay device, or electro-optical modulation device.

12. The method of claim 9, wherein the multi-band optical element is suitable for multiple bands including infrared, visible, ultraviolet and deep ultraviolet bands.

* * * * *